(12) United States Patent
Cho

(10) Patent No.: US 8,169,020 B2
(45) Date of Patent: May 1, 2012

(54) SEMICONDUCTOR DEVICE WITH BURIED BIT LINES AND METHOD FOR FABRICATING THE SAME

(75) Inventor: Yun-Seok Cho, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 164 days.

(21) Appl. No.: 12/649,107

(22) Filed: Dec. 29, 2009

(65) Prior Publication Data
US 2011/0101447 A1 May 5, 2011

(30) Foreign Application Priority Data
Oct. 30, 2009 (KR) .................... 10-2009-0104213

(51) Int. Cl.
*H01L 29/78* (2006.01)
(52) U.S. Cl. .................... 257/329; 257/E21.41; 438/270
(58) Field of Classification Search .................. 257/329, 257/E29.262, E21.41, E21.19; 438/587, 438/268
See application file for complete search history.

(56) References Cited

U.S. PATENT DOCUMENTS

| 5,798,544 | A | * | 8/1998 | Ohya et al. | 257/296 |
| 6,528,368 | B1 | * | 3/2003 | Park | 438/253 |
| 7,736,969 | B2 | * | 6/2010 | Abbott et al. | 438/239 |
| 7,795,620 | B2 | * | 9/2010 | Huang | 257/68 |
| 2007/0082448 | A1 | * | 4/2007 | Kim et al. | 438/268 |
| 2009/0004797 | A1 | * | 1/2009 | Lee | 438/270 |
| 2010/0244110 | A1 | * | 9/2010 | Kim et al. | 257/296 |
| 2011/0284939 | A1 | * | 11/2011 | Chung et al. | 257/296 |

FOREIGN PATENT DOCUMENTS

| KR | 1020040057783 | 7/2004 |
| KR | 1020040075021 | 8/2004 |
| KR | 100734313 B1 | 6/2007 |
| KR | 1020090099774 | 9/2009 |

OTHER PUBLICATIONS

Notice of Preliminary Rejection issued from Korean Intellectual Property Office on Jun. 8, 2011.

* cited by examiner

*Primary Examiner* — Thao Le
*Assistant Examiner* — Sheng Zhu
(74) *Attorney, Agent, or Firm* — IP & T Group LLP

(57) ABSTRACT

A semiconductor device includes a substrate having trenches, buried bit lines formed in the substrate, and including a metal silicide layer and a metallic layer, wherein the metal silicide layer contacts sidewalls of the trenches and the metallic layer is formed over the sidewalls of the trenches and contacts the metal silicide layer.

27 Claims, 19 Drawing Sheets

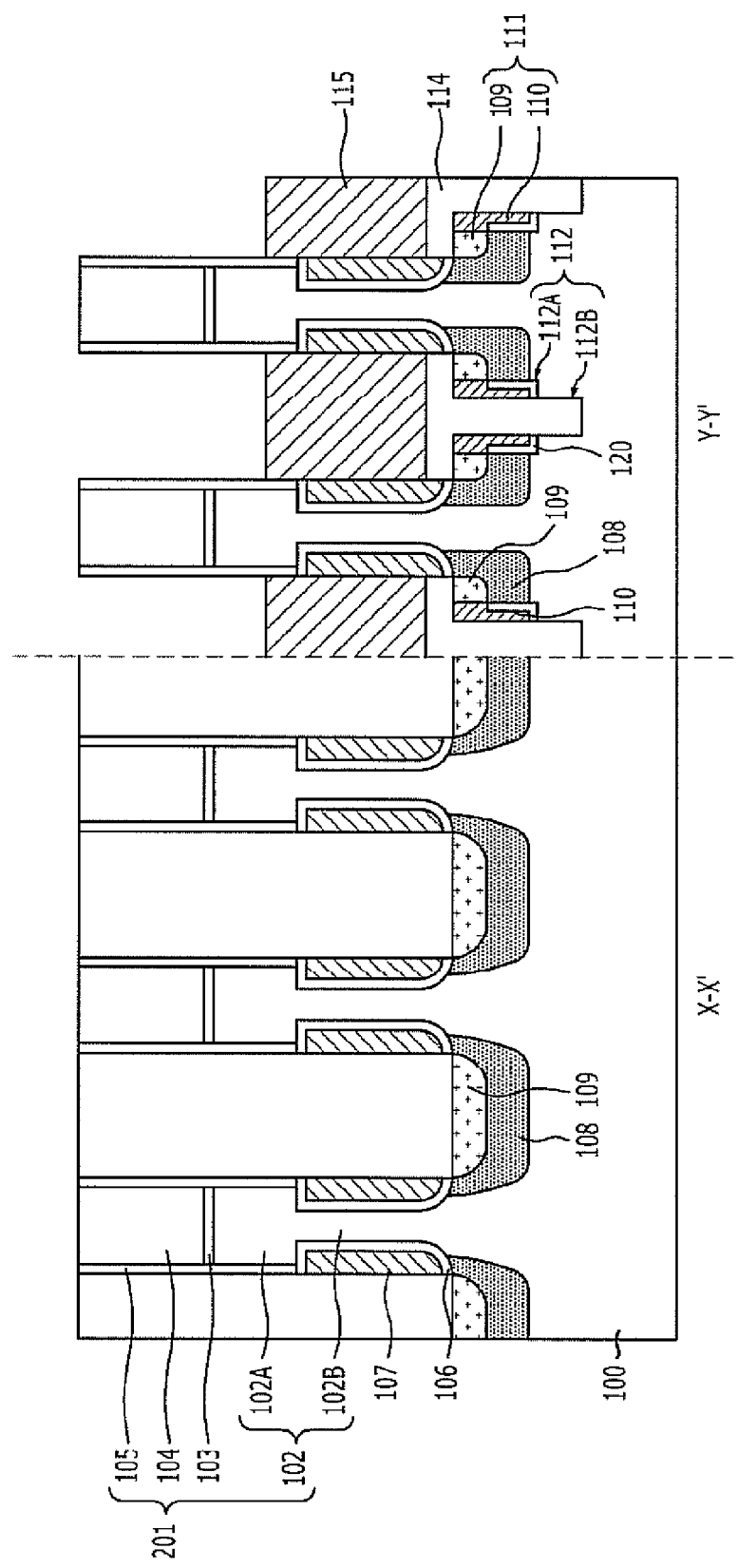

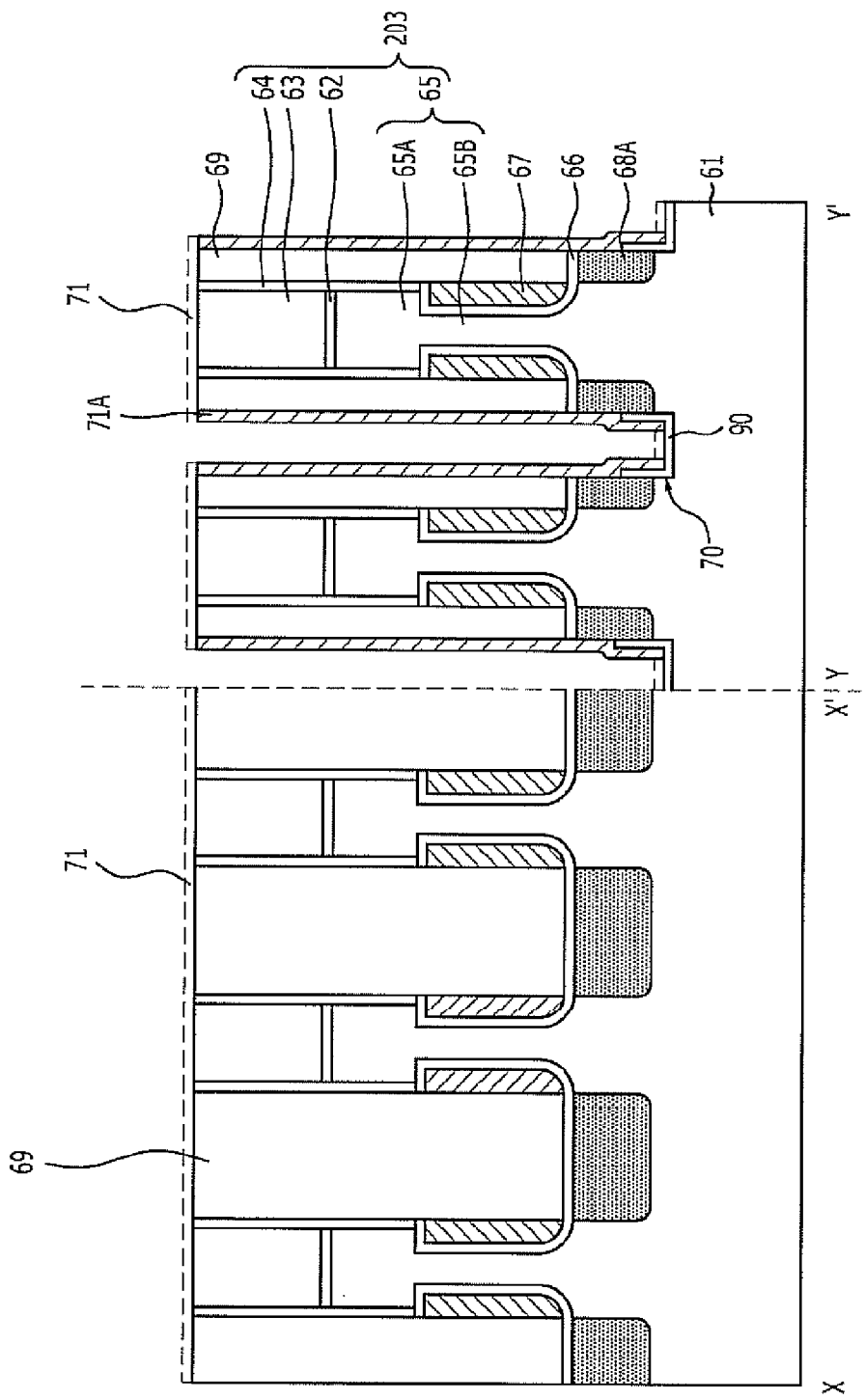

SEMICONDUCTOR DEVICE WITH BURIED BIT LINES AND METHOD FOR FABRICATING THE SAME

CROSS-REFERENCE TO RELATED APPLICATIONS

The present application claims priority of Korean Patent Application No. 10-2009-0104213, filed on Oct. 30, 2009, which is incorporated herein by reference in its entirety.

BACKGROUND OF THE INVENTION

Exemplary embodiments of the present invention relate to semiconductor fabricating technology, and more particularly, to a semiconductor device which has buried bit lines and a method for fabricating the same.

Recently, in the semiconductor industry, in order to increase the degree of integration, a DRAM below 40 nm is being developed. In this regard, in the case of a planar transistor or a recessed gate transistor which is used in an $8F^2$ or $6F^2$ cell architecture where F is a minimum feature size, difficulties exist in scaling below 40 nm. Hence, a DRAM having a $4F^2$ cell architecture capable of improving the degree of integration 1.5~2 times at the same scaling condition is desired, and thus, a vertical channel transistor has been proposed.

In the vertical channel transistor, an annular gate electrode is formed to surround an active pillar which extends vertically on a semiconductor substrate, and a source region and a drain region are respectively formed in the upper and lower portions of the active pillar when viewed from the gate electrode, so that a channel is defined in the vertical direction. Thus, even when the area of the transistor is reduced, a channel length is not adversely influenced.

FIGS. 1A and 1B are views illustrating a conventional semiconductor device with buried bit lines, wherein FIG. 1A is a cross-sectional view and FIG. 1B is a plan view.

Referring to FIGS. 1A and 1B, a plurality of pillar structures 200 each including a body pillar 12, a head pillar 13, a buffer layer pattern 14, a hard mask layer pattern 15 and a capping layer 16 are formed on a substrate 11.

The outer surface of the body pillar 12 is surrounded by a gate insulation layer 17 and a gate electrode 18. An impurity region is formed in the substrate 11 through impurity ion implantation to serve as a source region or a drain region and at the same time as a buried bit line 19. An interlayer dielectric 20 is filled in a trench 19A which separates adjoining bit lines 19 from each other.

Word lines 21 are formed in a direction in which they are connected with gate electrodes 18 and cross with buried bit lines 19.

In the conventional art, since the buried bit line 19 is formed by implanting impurity ions into the substrate 11, for example, a silicon substrate, the buried bit line 19 is formed in the form of not a metal layer but a silicon wiring line. Therefore, because the specific resistance of the silicon wiring line is relatively larger than that of the metal layer, a concern is raised in that the resistance of the buried bit line 19 increases.

More specifically, since not a metal layer but silicon doped with impurities is used to form the buried bit line 19, the resistance of the buried bit line 19 increases, and due to such an increase, the operating speed of the semiconductor device decreases, which raises a concern.

In order to cope with these concerns, it is desirable to enlarge a current path, designated by the reference symbol 'I', of the buried bit line 19 as shown in FIG. 1B, and thus the pitch of the buried bit lines 19 may increase. However, in this case, another concern is raised in that an area of a unit cell area ($4F^2=2F\times2F$) may increase.

SUMMARY OF THE INVENTION

Embodiments of the present invention are directed to a semiconductor device with buried bit lines which can realize high speed operation and a method for fabricating the same.

In accordance with an embodiment of the present invention, a semiconductor device includes a substrate having trenches, buried bit lines formed in the substrate, and including a metal silicide layer and a metallic layer, wherein the metal silicide layer contacts sidewalls of the trenches and the metallic layer is formed over the sidewalls of the trenches and contacts the metal silicide layer.

In accordance with another embodiment of the present invention, a method for fabricating a semiconductor device includes forming a metal silicide layer in a substrate, forming first trenches by selectively etching the substrate such that the metal silicide layer contacts sidewalls of the first trenches, and forming buried bit lines including the metal silicide layer and a metallic layer, wherein the metallic layer is formed on the sidewalls of the first trenches, and the metallic layer contacts the metal silicide layer.

In accordance with another embodiment of the present invention, a method for fabricating a semiconductor device includes forming first trenches by selectively etching a substrate, forming a metallic layer on sidewalls of the first trenches, and forming buried bit lines including the metal layer and a metal silicide layer, wherein the metal silicide layer is formed in the substrate by conducting an annealing, and the metal silicide layer contacts the metallic layer.

BRIEF DESCRIPTION OF THE DRAWINGS

FIGS. 2A through 2C are views illustrating a semiconductor device with buried bit lines in accordance with an embodiment of the present invention.

FIGS. 4A through 4F are cross-sectional views illustrating a method for fabricating a semiconductor device with buried bit lines in accordance with another embodiment of the present invention.

DESCRIPTION OF SPECIFIC EMBODIMENTS

Figure 1A:
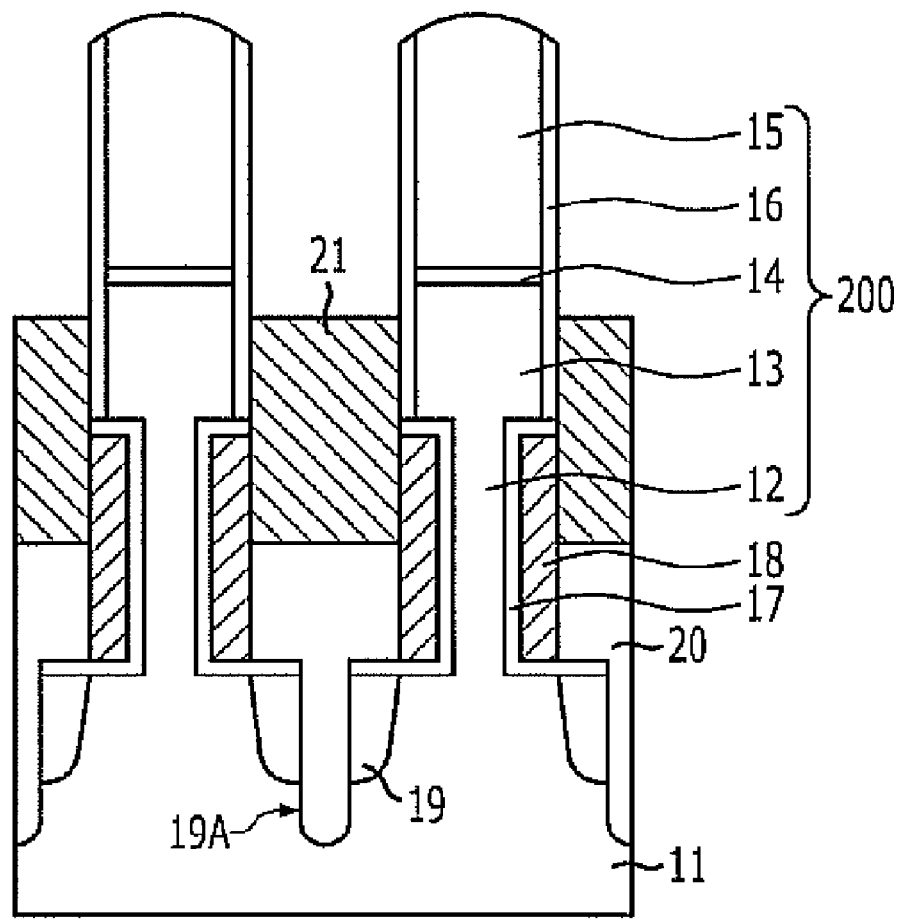
FIGS. 1A and 1B are views illustrating a conventional semiconductor device with buried bit lines.
Figure 1B:
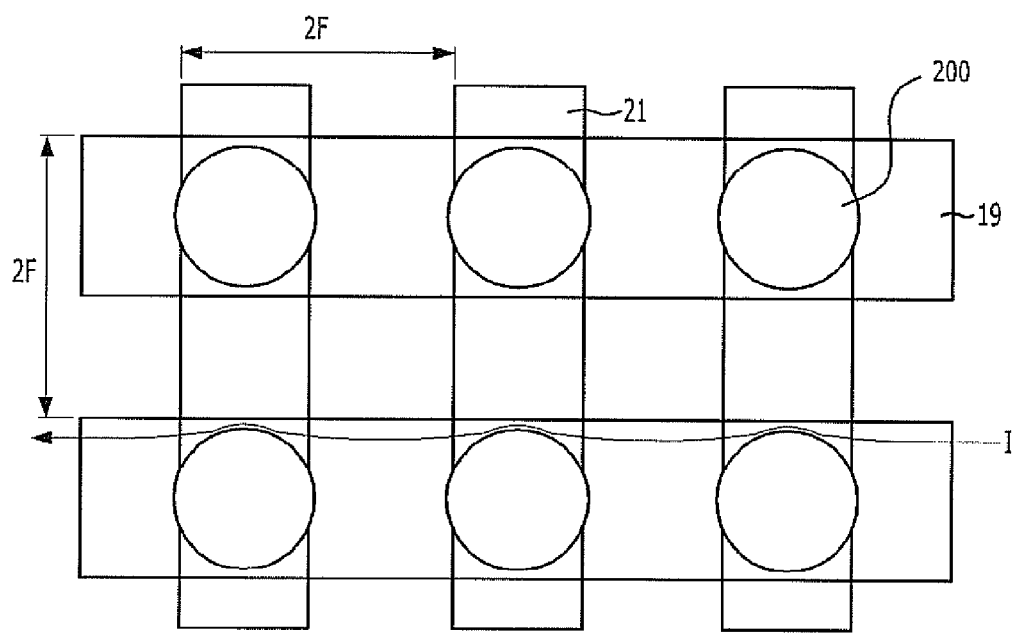

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Embodiments of the present invention as described below provide a semiconductor device with buried bit lines and a method for fabricating the same. To this end, in the embodiments of the invention, each of the buried bit lines includes a metal silicide layer and a metallic layer.

Figure 2A:
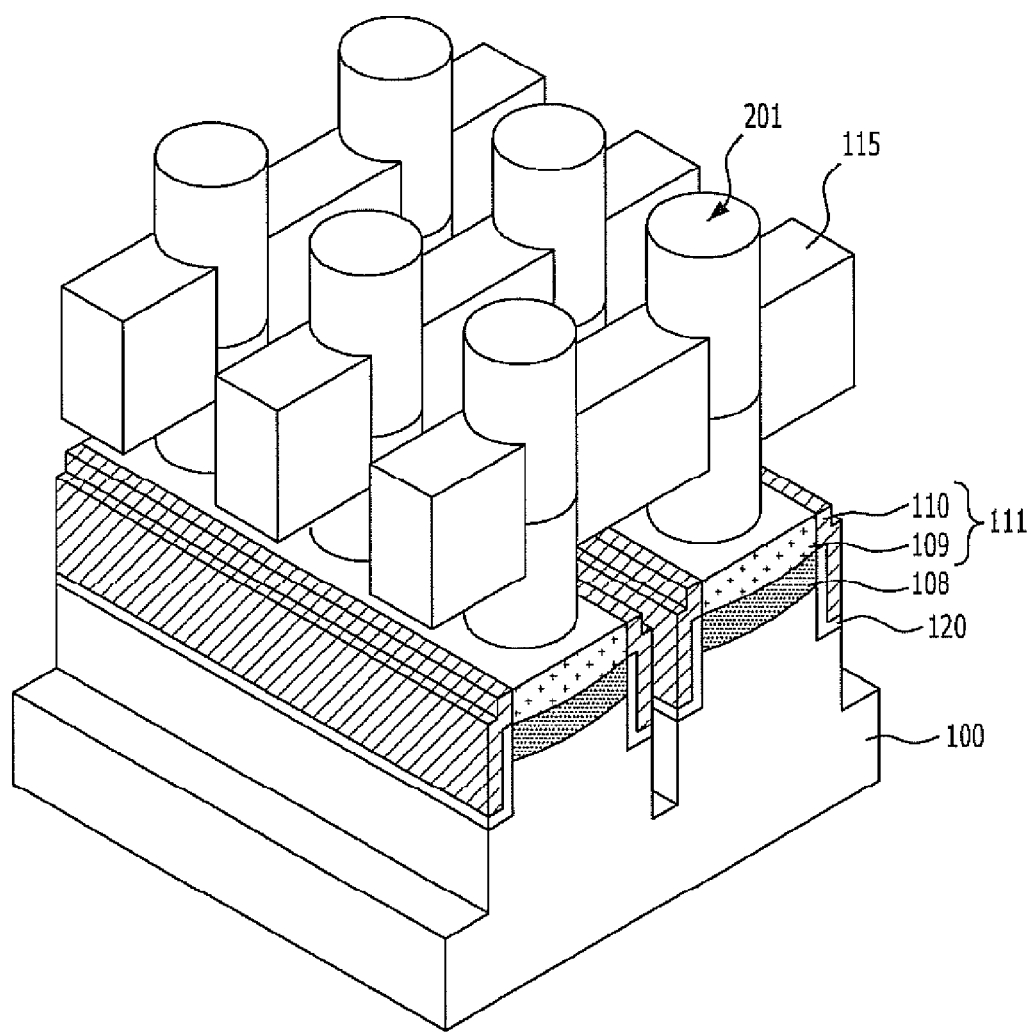
Figure 2B:
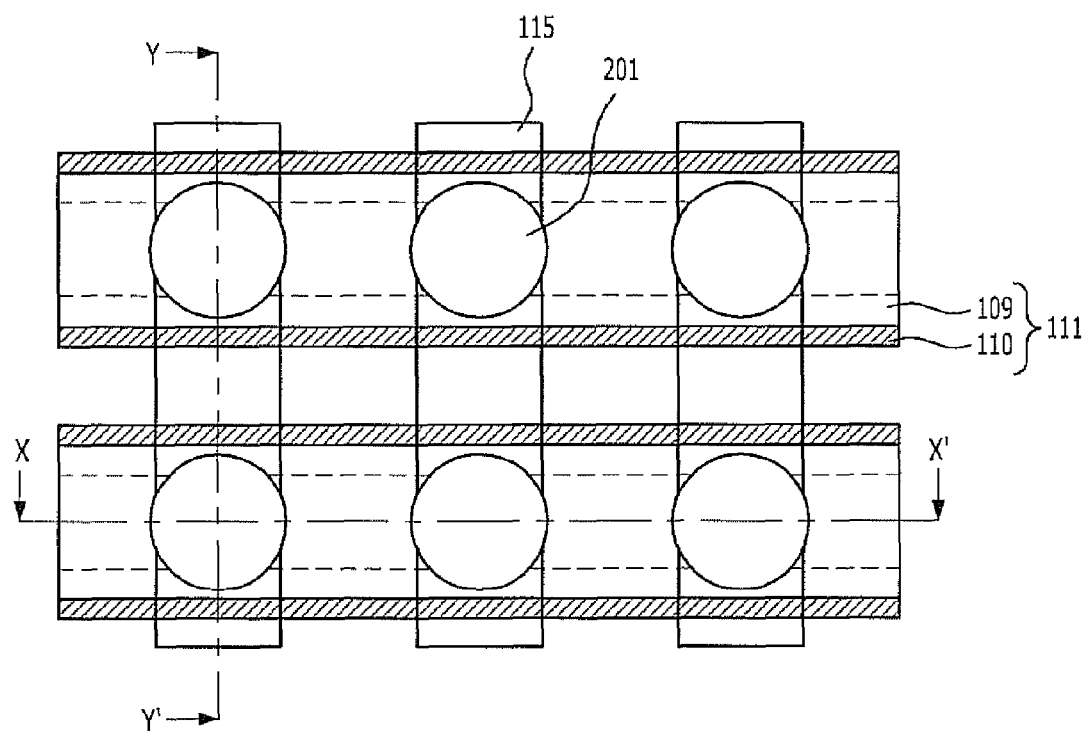

FIGS. 2A through 2C are views illustrating a semiconductor device with buried bit lines in accordance with an embodiment of the present invention, wherein FIG. 2A is a perspective view, FIG. 2B is a plan view and FIG. 2C is a cross-sectional view taken along the lines X-X' and Y-Y' of FIG. 2B.

Referring to FIGS. 2A through 2C, a plurality of pillar structures 201 are formed on a substrate 100, for example, a silicon substrate, in the form of a matrix such that they are separated from one another by a predetermined distance and extend in the vertical direction. As shown in FIG. 2C, each pillar structure 201 may include an active pillar 102, a buffer layer pattern 103, a hard mask pattern 104 and a capping layer 105. The active pillar 102 may be a jar type which is composed of a head pillar 102A and a body pillar 102B, or a rod type. The jar type active pillar 102 makes it easy to secure a processing margin in a process for forming buried bit lines 111. The buffer layer pattern 103, the hard mask layer pattern 104 and the capping layer 105 will be described in detail in a method for fabricating a semiconductor device in accordance with another embodiment of the present invention.

A gate insulation layer 106 is formed on the surface of the active pillar 102, and a gate electrode 107 is formed on the gate insulation layer 106 to surround the outer surface of the gate insulation layer 106. Word lines 115 are formed to connect gate electrodes 107 in the Y-Y' direction, that is, a direction that crosses buried bit lines 111. The gate insulation layer 106 may include an oxide layer, for example, a silicon oxide layer ($SiO_2$). The gate electrode 107 may include a polysilicon layer or a metallic layer, and the word line 115 may include a metallic layer. The word line 115 may include any one selected from the group consisting of a tungsten silicide layer (WSi), a titanium nitride layer (TiN), a tungsten layer (W), an aluminum layer (Al), a copper layer (Cu), a gold layer (Au) and a ruthenium layer (Ru). A barrier metal layer (not shown) may be additionally formed between the gate electrode 107 and the word line 115. The barrier metal layer may include at least any one selected from the group consisting of a titanium nitride layer (TiN), a tantalum carbon nitride layer (TaCN), a tantalum carbon layer (TaC), a tungsten nitride layer (WN), a tungsten silicon nitride layer (WSiN), a tantalum nitride layer (TaN), a titanium layer (Ti) and a tungsten silicide layer (WSi).

An impurity region 108 is formed in the substrate 100 between the active pillars 102. The impurity region 108 may be formed by implanting impurity ions into the substrate 100 and serves as the source/drain region of a vertical channel transistor. The impurity region 108 serves not only as the source/drain region but also as a portion of the buried bit line 111.

The buried bit lines 111 have trenches 112 which are defined in the substrate 100, and include a metal silicide layer 109 which contacts the sidewalls of the trenches 112 and a metallic layer 110 which contacts the metal silicide layer 109. At this time, the metallic layer 110 may contact only the metal silicide layer 109 or both the metal silicide layer 109 and the impurity region 108.

It is preferred that the metal silicide layer 109 and the metallic layer 110 of buried bit line 111 be formed of a material having lower specific resistance than the substrate 100 or the impurity region 108 where the resistance of the buried bit line 111 is lower than when it is formed of a conventional silicon wiring line.

As the metal silicide layer 109 of the buried bit line 111, any one selected from the group consisting of a titanium silicide layer (TiSi), a tantalum silicide layer (TaSi), a cobalt silicide layer (CoSi), a nickel silicide layer (NiSi) and a tungsten silicide layer (WSi) may be used. The metal silicide layer 109 is used as the portion of the buried bit line 111 because metal silicide has lower resistance than the impurity region 108, that is, silicon doped with impurities. Thus, an ohmic contact is formed between the silicon (that is, the impurity region 108) and the metal silicide layer 109 including the metal silicide so that contact resistance between them can be reduced.

The metallic layer 110 of the buried bit line 111 may be a single layer composed of a metal-based layer or a metal nitride layer or a stack layer in which a metal-based layer and a metal nitride layer are stacked. According to an example, the metallic layer 110 is formed of the stack layer of the metal-based layer and metal nitride layer rather than the single layer of the metal-based layer or the metal nitride layer. When the metallic layer 110 is formed of the stack layer, a process for forming the metal silicide layer 109 can be simplified and the metallic layer 110 performs a function of decreasing a potential barrier step between the impurity region 108 and the metal nitride layer 109 to thereby decrease the contact resistance between the impurity region 108 and the metal nitride layer 109.

The metal-based layer and the metal nitride layer constituting the metallic layer 110 of the buried bit line 111 may contain any one metal element selected from the group consisting of titanium (Ti), tantalum (Ta), cobalt (Co), nickel (Ni) and tungsten (W). By forming the metallic layer 110 to include the selected metal element, the metallic layer 110 forms an ohmic contact between the metal silicide layer 109 and the impurity region 108 so that the contact resistance therebetween can be reduced.

In order to prevent the buried bit line 111 and the substrate 100 from being short-circuited, an isolation layer 120 is interposed between the surface of the trench 112 (excluding a region where the metal silicide layer 109 or the metal silicide layer 109 and the impurity region 108 contact the metallic layer 110) and the metallic layer 110. The isolation layer 120 can be formed of an insulation layer and plays a role of electrically isolating the substrate 100 from the metallic layer 110. In general, without the isolation layer 120, a Schottky junction may be formed between the substrate 100, for example, a silicon substrate, and the metallic layer 110, if the isolation layer 120, and thus, current can flow easily from the metallic layer 110 to the substrate 100 and cause a degradation of the operational characteristics of the semiconductor device.

The trench 112 formed in the substrate 100 separates adjoining buried bit lines 111. The metal silicide layer 109 can be formed on one side surface of the trench 112 or on both side surfaces of the trench 112 as shown in FIG. 2C.

In the case of the structure in which the metal silicide layer 109 is formed on both side surfaces of the trench 112, the trench 112, which separates adjoining impurity regions 108 and adjoining buried bit lines 111, may include a first trench 112A which passes through the impurity region 108 and the metal silicide layer 109 of the buried bit line 111 and a second trench 112B which is formed under the first trench 112A to have a line width smaller than the first trench 112A and separates the metallic layer 110 of adjoining buried bit lines 111. At this time, in order to effectively separate the metallic layer 110 of the adjoining buried bit lines 111, the metal layer 110 of the buried bit lines 111 may be positioned on both of the side surfaces of the first trench 112A as shown.

Therefore, in the present invention, since the buried bit line 111 including the metal silicide layer 109 and the metallic layer 110 is formed in addition to the impurity region 108, the resistance of the buried bit line 111 can be significantly reduced, and through such a reduction in resistance, high speed operation of the semiconductor device can be ensured. Also, because an increase the pitch of the buried bit lines 111 is not necessary, a unit cell area can be maintained within limits and the characteristics of the semiconductor device which operates at a high speed can be satisfied.

Furthermore, due to the fact that the second trench 112B is formed to separate the metallic layers 110 of adjoining buried bit lines 111, the insulation characteristics between the adjoining buried bit lines 111 can be improved.

FIGS. 3A through 3H are cross-sectional views illustrating a method for fabricating a semiconductor device with buried bit lines in accordance with another embodiment of the present invention, where the views represent cross-sections along the lines X-X' and Y-Y' of FIG. 2B.

Figure 3A:
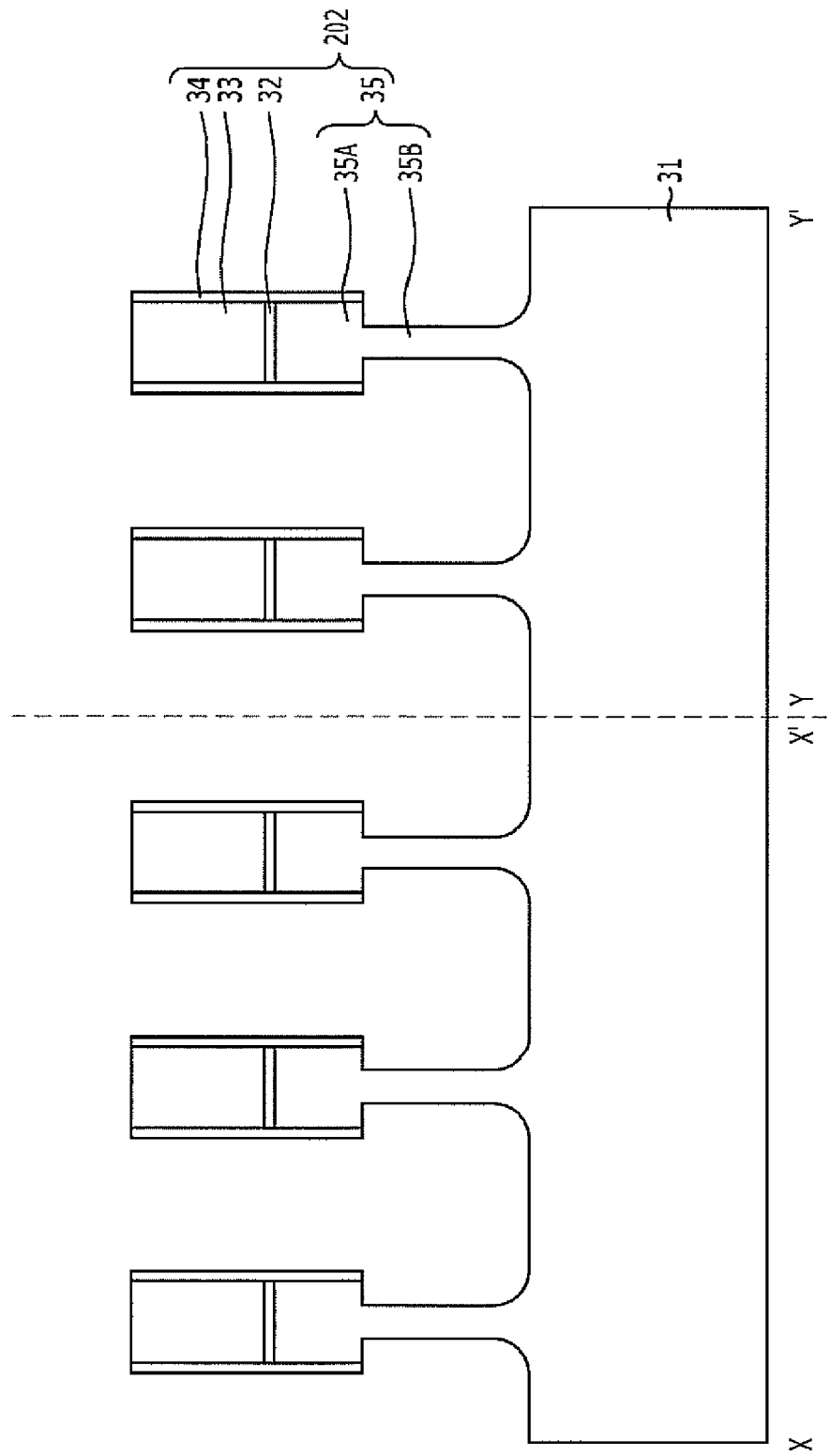
FIGS. 3A through 3H are cross-sectional views illustrating a method for fabricating a semiconductor device with buried bit lines in accordance with another embodiment of the present invention.

Referring to FIG. 3A, a plurality of pillar structures 202 are formed on a substrate 31, for example, a silicon substrate, in a manner such that they are separated from one another by a predetermined distance in a matrix shape and respectively include active pillars 35 extending in the vertical direction from the substrate 31. As shown in the drawing, the active pillar 35 may be formed into a jar type which is composed of a head pillar 35A and a body pillar 35B, or a rod type. The active pillar 35 formed as the jar type rather than the rod type makes it easy to secure a processing margin in a subsequent process for forming buried bit lines.

Hereafter, processes for forming the active pillar 35 which is composed of the head pillar 35A and the body pillar 35B will be described in detail.

Buffer layer patterns 32 and hard mask layer patterns 33 are sequentially formed on the substrate 31. The buffer layer patterns 32 may be formed from a silicon oxide layer ($SiO_2$) through a thermal oxidation process to have a thickness from approximately 50 Å to approximately 150 Å. The hard mask layer patterns 33 may be formed of a silicon nitride layer ($Si_3N_4$) or a silicon carbide layer (SiC) to a thickness of approximately 2,000 Å. The buffer layer patterns 32 and the hard mask layer patterns 33 may be formed through etching using photoresist patterns (not shown).

Primary etching (hereafter referred to as "primary pillar etching") in which the substrate 31 is etched by a predetermined depth, for example, by approximately 1,100 Å, using the hard mask layer patterns 33 as etch barriers, is conducted. Head pillars 35A, which serve as active regions, are formed through the primary pillar etching. The etching of the substrate 31 for forming the head pillars 35A may be conducted as anisotropic etching by using solely a $Cl_2$ or HBr gas or a mixed gas of $Cl_2$ and HBr gases.

A capping layer 34 is formed over the resultant structure. The capping layer 34 may be formed by solely despositing a nitride layer or by sequentially depositing an oxide layer and a nitride layer. The oxide layer may include a silicon oxide layer ($SiO_2$), and the nitride layer may include a silicon nitride layer ($Si_3N_4$). By conducting a directional etching process, for example, an etch-back process, the capping layer 34 remains on the sidewalls of the head pillars 35A and the surface of the substrate 31 is exposed between the head pillars 35A. By conducting the directional etching process, the capping layer 34 also remains on the sidewalls of the hard mask layer patterns 33 and the buffer layer patterns 32. The capping layer 34 functions to protect the sidewalls of the head pillars 35A from subsequent processes and may be formed to a thickness from approximately 50 Å to approximately 100 Å.

Secondary pillar etching is conducted where the resultant structure after the primary pillar etching is etched back using the capping layer 34 and the hard mask layer patterns 33 as etch barriers and then the substrate exposed is additionally etched by a predetermined depth, for example, by approximately 2,000 Å. Directional etching is employed as the secondary pillar etching. By conducting the second pillar etching, body pillars 35B are formed under the head pillars 35A. The body pillars 35B may have a height greater than the head pillars 35A formed through the primary pillar etching. The second pillar etching for forming the body pillars 35B may be conducted through anisotropic dry etching using solely a $Cl_2$ or HBr gas or a mixed gas of $Cl_2$ and HBr gases.

Tertiary pillar etching for isotropically etching the sidewalls of the body pillars 35B is conducted. The tertiary pillar etching that adopts isotropic etching is conducted as wet etching or chemical dry etching (CDE). The isotropic etching process is referred to as "a pillar trimming process." The isotropic etching is conducted only on the exposed sidewalls of the body pillars 35B to a thickness of approximately 150 Å and is not conducted on the head pillars 35A which are covered by the capping layer 34.

Therefore, the body pillars 35B which have undergone the isotropic etching and the head pillars 35A which are formed over the body pillars 35B constitute a T-shaped pillar structure. The body pillars 35B serve to surround gate electrodes which are subsequently formed, and the head pillars 35A which are covered by the capping layer 34 allow subsequently formed storage nodes to be vertically connected thereto.

Through the above-described series of etching processes, the plurality of pillar structures 202, which include the active pillars 35 including the head pillars 35A and the body pillars 35B, the capping layer 34, the buffer layer patterns 32 and the hard mask layer patterns 33, are formed on the substrate 31.

Figure 3B:
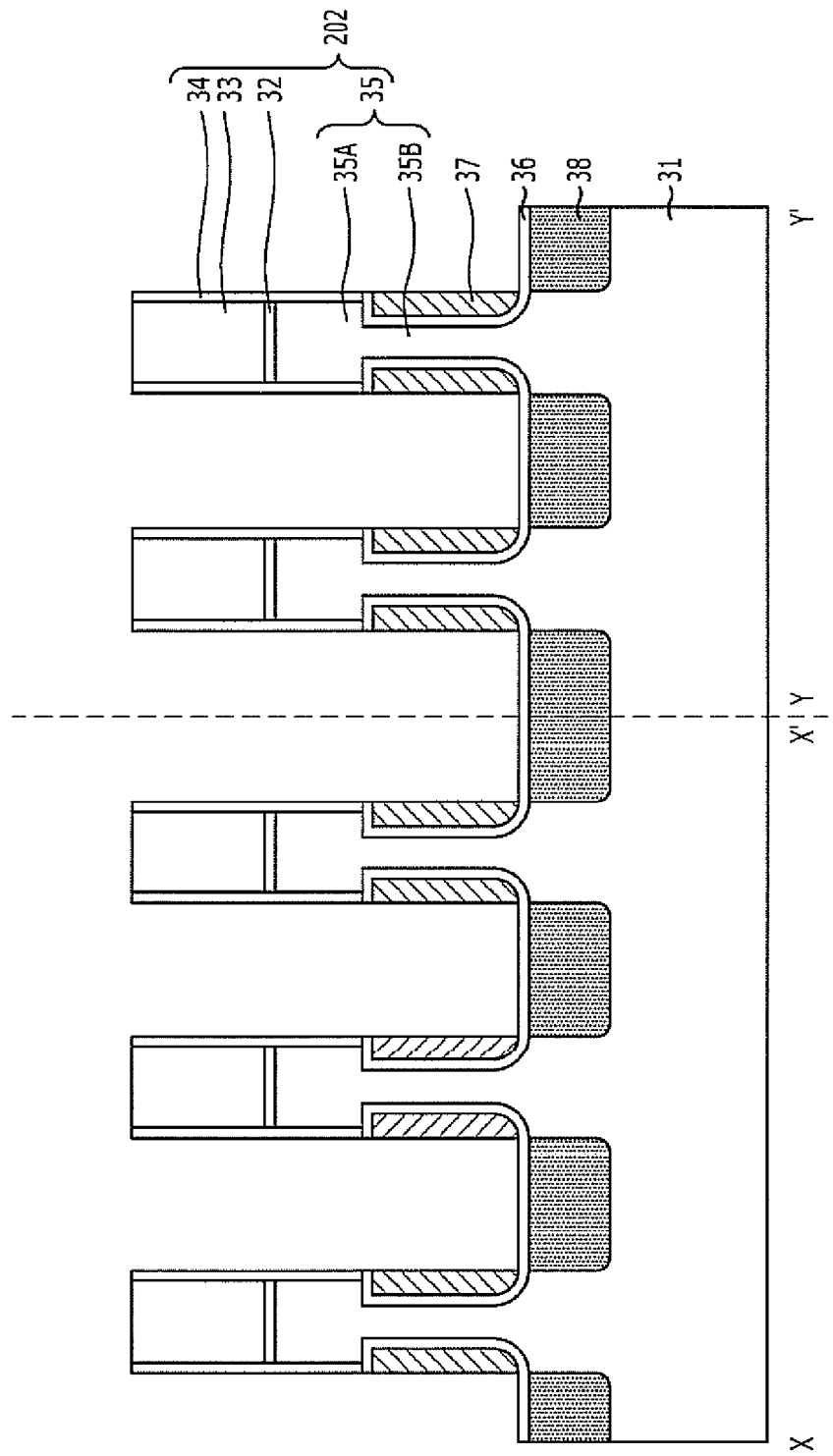

Referring to FIG. 3B, a gate insulation layer 36 is formed on the exposed surfaces of the substrate 31 and the body pillars 35B. The gate insulation layer 36 may be formed of an oxide layer, for example, a silicon oxide layer. The gate insulation layer 36 may be formed through a deposition process or an oxidation process to a thickness of approximately 50 Å.

Gate electrodes 37 are formed in such a way as to surround the sidewalls of the body pillars 35B on which the gate insulation layer 36 is formed. The gate electrodes 37 are obtained by depositing a conductive layer over the resultant structure after forming the gate insulation layer 36 and conducting etch-back until the gate insulation layer 36 on the substrate 31 is exposed between the active pillars 35. As the gate electrodes 37, a polysilicon layer doped with N-type impurities or a polysilicon layer doped with P-type impurities may be employed. Also, the gate electrodes 37 may include a metal-containing layer such as a silicon germanium layer (SiGe), a tungsten layer (W), a tungsten silicide layer (WSi) and a titanium nitride layer (TiN).

By implanting impurity ions into the substrate 31 between the active pillars 35, impurity regions 38 are formed in the substrate 31. The impurity regions 38 serve as source/drain regions. The impurity regions 38 not only serve as source/drain regions but also serve as portions of buried bit lines. Here, as the impurities, N-type impurities such as phosphorus (P) and arsenic (As) or N-type impurities such as boron (B) may be used.

Figure 3C:
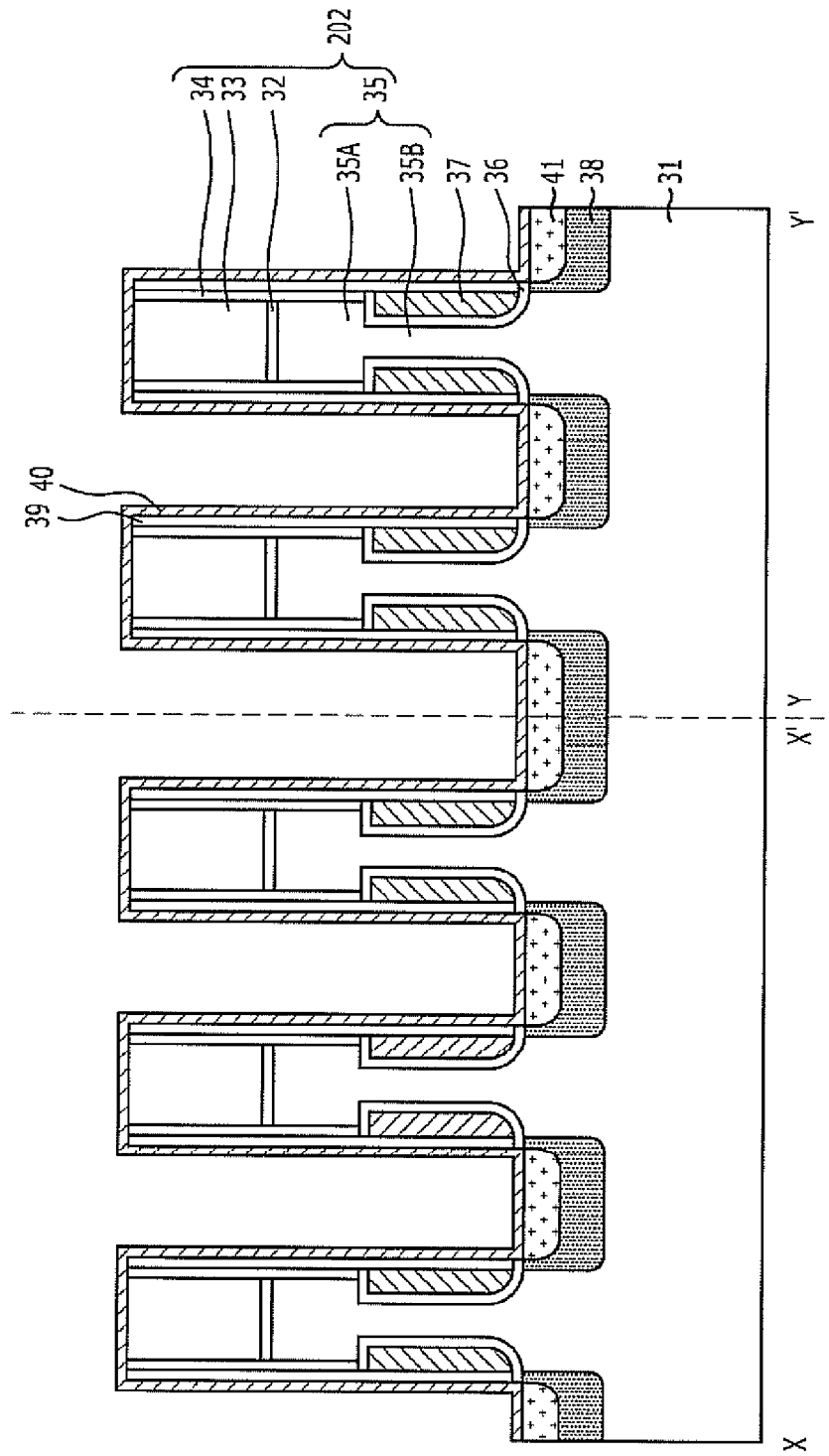

Referring to FIG. 3C, a protective layer 39 is formed on the sidewalls of the pillar structures 202. The protective layer 39 performs a function of preventing the previously formed pillar structures 202 from being damaged when subsequently conducting a process for forming a metal silicide layer of the buried bit lines.

The protective layer 39 may be formed of any one selected from the group consisting of an oxide layer, a nitride layer, an oxynitride layer and carbon-containing layer, or a stack thereof. When the protective layer 39 is formed of a carbon-containing layer, it has an etching selectivity with respect to the previously formed structure and can be easily removed in a subsequent process. As the carbon-containing layer, any one of an amorphous carbon layer (ACL), a silicon carbide layer (SiC) and a polymer layer may be employed.

Portions of the gate insulation layer 36, which are present on the substrate 31 between the active pillars 35 as shown in FIG. 3B, are etched using the pillar structures 202 and the protective layer 39 as etch barriers. For example, by selectively etching the gate insulation layer 36, the surface of the substrate 31 (that is, the surfaces of the impurity regions 38) are exposed between the active pillars 35.

A metal layer 40 is formed over the resultant structure including the protective layer 39. The metal layer 40 is used in forming the metal silicide layer of the buried bit lines. The metal layer 40 may be formed using any one selected from the group consisting of titanium (Ti), tantalum (Ta), cobalt (Co), nickel (Ni) and tungsten (W).

Through annealing, the substrate 31, for example, a silicon substrate, and the metal layer 40 may react with each other, by which the metal silicide layer 41 of the buried bit lines is formed. The metal silicide layer 41 of the buried bit lines can include any one selected from the group consisting of a titanium silicide layer (TiSi), a tantalum silicide layer (TaSi), a cobalt silicide layer (CoSi), a nickel silicide layer (NiSi) and a tungsten silicide layer (WSi). By forming the metal silicide layer 41 of the buried bit lines where the resistance of the metal silicide layer 41 is lower than the impurity region 38 (that is, silicon doped with impurities), an ohmic contact is formed between the substrate 31 (that is, the impurity region 38) and the metal silicide layer 41 including the metal silicide so that contact resistance between them can be reduced.

According to an example, the annealing may be conducted as rapid thermal annealing so as to minimize a thermal burden imposed on the previously formed structure.

Through the above-described process procedure, the metal silicide layer 41 of the buried bit lines can be formed so as to contact the impurity regions 38 which are formed in the substrate 31.

Figure 3D:
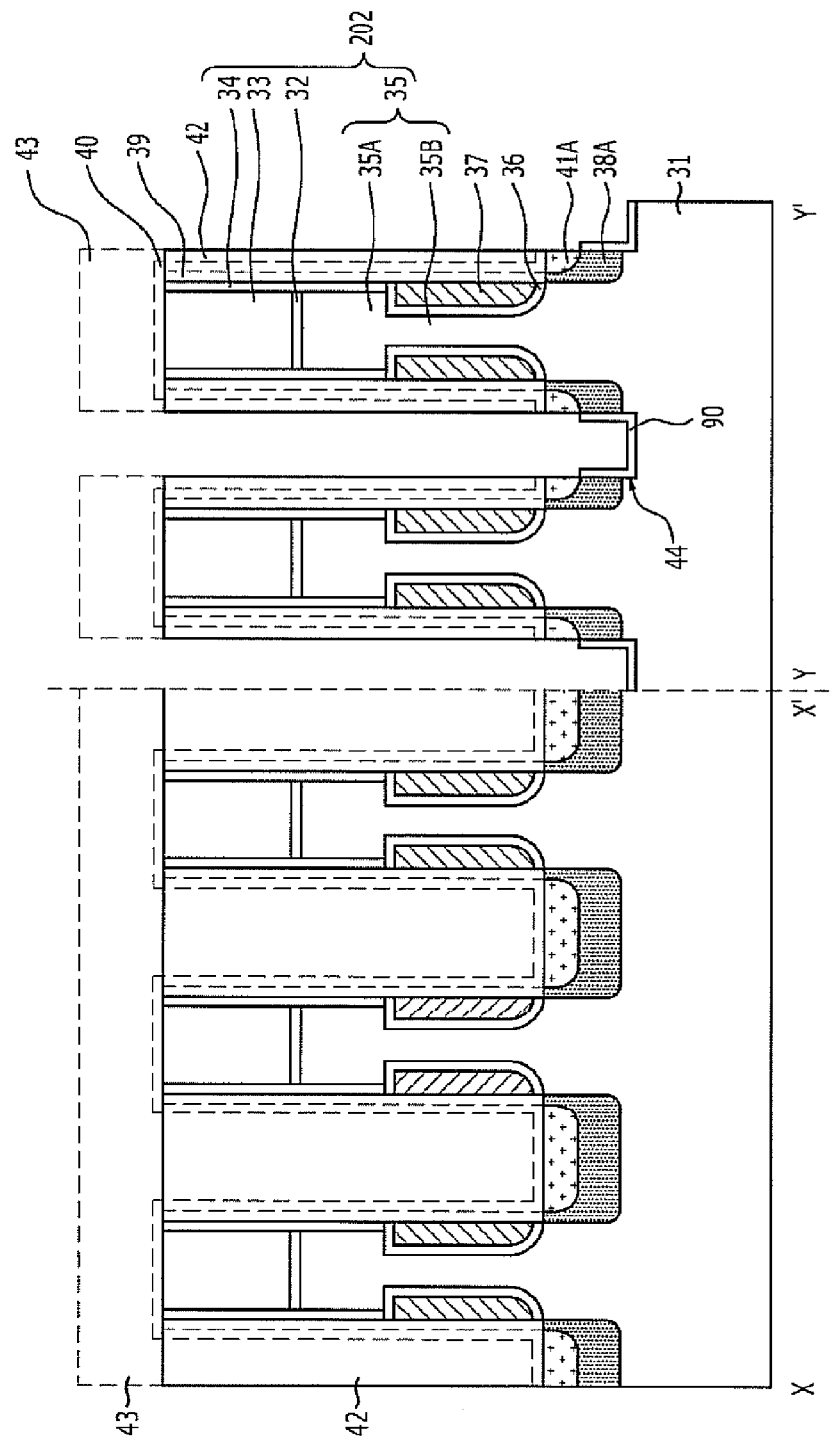

Referring to FIG. 3D, the metal layer 40, which has not reacted during the annealing for forming the metal silicide layer 41 of the buried bit lines and remains, is removed. The metal layer 40 which has not reacted may be removed using an SPM (sulfuric peroxide mixture) solution in which sulfuric acid ($H_2SO_4$) and hydrogen peroxide ($H_2O_2$) are mixed or aqua regia in which hydrochloric acid and nitric acid are mixed.

The protective layer 39 is removed. For example, in the case where the protective layer 39 is formed of the carbon-containing layer, the protective layer 39 may be removed using $O_2$ plasma treatment.

A first insulation layer 42 is formed over the resultant structure in such a way as to fill the gaps between the pillar structures 202. The first insulation layer 42 may be formed from any one selected from the group consisting of an oxide layer, a nitride layer and an oxynitride layer. According to an example, a BPSG (boron phosphorus silicate glass) layer which has better gapfill characteristics may be formed as the first insulation layer 42.

After the first insulation layer 42 is formed, a planarization process such as CMP (chemical mechanical polishing) may be conducted until the surfaces of the hard mask layer patterns 33 are exposed and remove surface unevenness.

First photoresist patterns 43 forming lines with spaces in-between are formed and expose the surface of the first insulation layer 42 between the pillar structures 202 which are arranged in the Y-Y' direction. The surface of the first insulation layer 42 between the pillar structures 202 which are arranged in the X-X' direction become covered by the first photoresist patterns 43.

The first insulation layer 42, the metal silicide layer 41 of the buried bit lines, and the impurity regions 38 are sequentially etched using the first photoresist patterns 43 as etch barriers, and subsequently, the substrate 31 is etched partially, as a result of which first trenches 44 are formed. Thus, the first trenches 44 are formed to pass through the metal silicide layer 41 of the buried bit lines and the impurity regions 38. Hereafter, the metal silicide layer 41 of the buried bit lines which is divided by the first trenches 44 will be denoted by the reference numeral 41A, and the impurity regions 38 which are divided by the first trenches 44 will be denoted by the reference numeral 38A.

The first photoresist patterns 43 are removed.

An isolation layer 90 is formed to cover portions of the first trenches 44. More specifically, the isolation layer 90 is formed to cover surface portions of each first trench 44 excluding the sidewalls of the first trench 44 over the metal silicide layer 41A (as shown) or the surface portion of each first trench 44 excluding the sidewalls of the first trench 44 over the metal silicide layer 41A and the impurity regions 38A (not shown). The isolation layer 90 functions to electrically isolate a metallic layer of the buried bit lines (to be formed through a subsequent process) and the substrate 31, and may be formed of an insulation layer.

The isolation layer 90 may be formed through a series of processes of depositing an insulation layer (not shown) for an isolation layer along the surface of the resultant structure including the first trenches 44, depositing a sacrificial layer (not shown) to partially fill the first trenches 44, removing the insulation layer for an isolation layer which is exposed out of the sacrificial layer, and then removing the sacrificial layer.

Figure 3E:
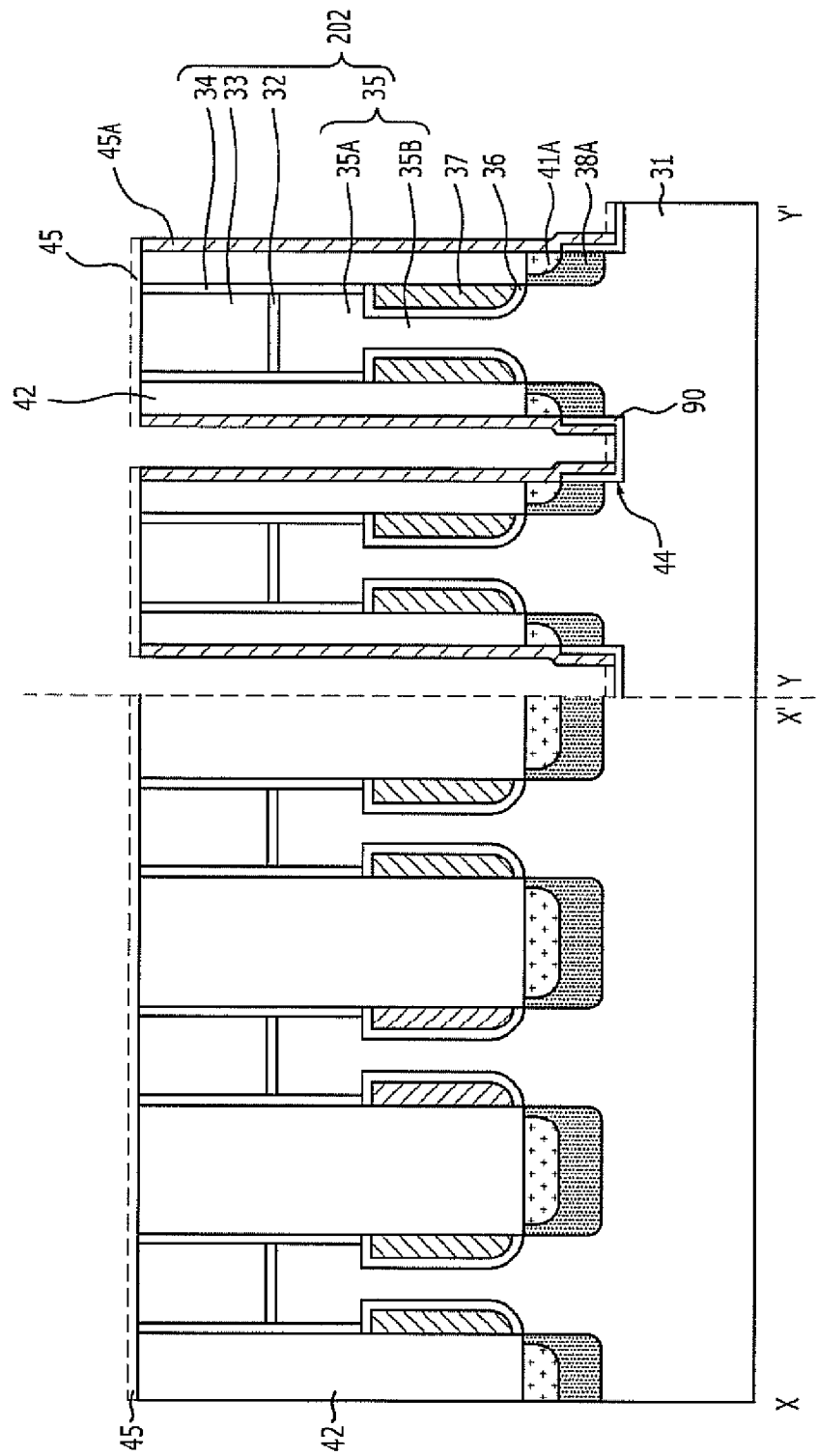

Referring to FIG. 3E, a conductive layer 45 forming the metallic layer of the buried bit lines is formed over the resultant structure including the first trenches 44. The conductive layer 45 may be formed of a single layer composed of a metal-based layer or a metal nitride layer or a stack layer in which a metal-based layer and a metal nitride layer are stacked. As the metal-based layer, any one selected from the group consisting of a titanium layer (Ti), a tantalum layer (Ta), a cobalt layer (Co), a nickel layer (Ni) and a tungsten layer (W) may be used. As the metal nitride layer, any one selected from the group consisting of a titanium nitride layer (TiN), a tantalum nitride layer (TaN), a cobalt nitride layer (CoN), a nickel nitride layer (NiN) and a tungsten nitride layer (WN) may be used.

The stack layer of the metal-based layer and the metal nitride layer constituting the conductive layer 45 contain any one metal element selected from the group consisting of titanium (Ti), tantalum (Ta), cobalt (Co), nickel (Ni) and tungsten (W). When the conductive layer 45 containing the metal element forms an ohmic contact between the metal silicide layer 41 of the buried bit lines and the impurity regions 38, the contact resistance therebetween can be reduced.

By conducting a first blanket etching process, the conductive layer 45 remains only on both sidewalls of the first trenches 44 and on the first insulation layer 42 which are present on the sidewalls of the pillar structures 202. The first blanket etching process may be conducted as an etch-back process. Hereafter, the etched conductive layer 45 will be denoted by the reference numeral 45A.

The first blanket etching process is conducted to divide the conductive layer 45A for the metallic layer of the buried bit lines, between adjoining cells.

Figure 3F:
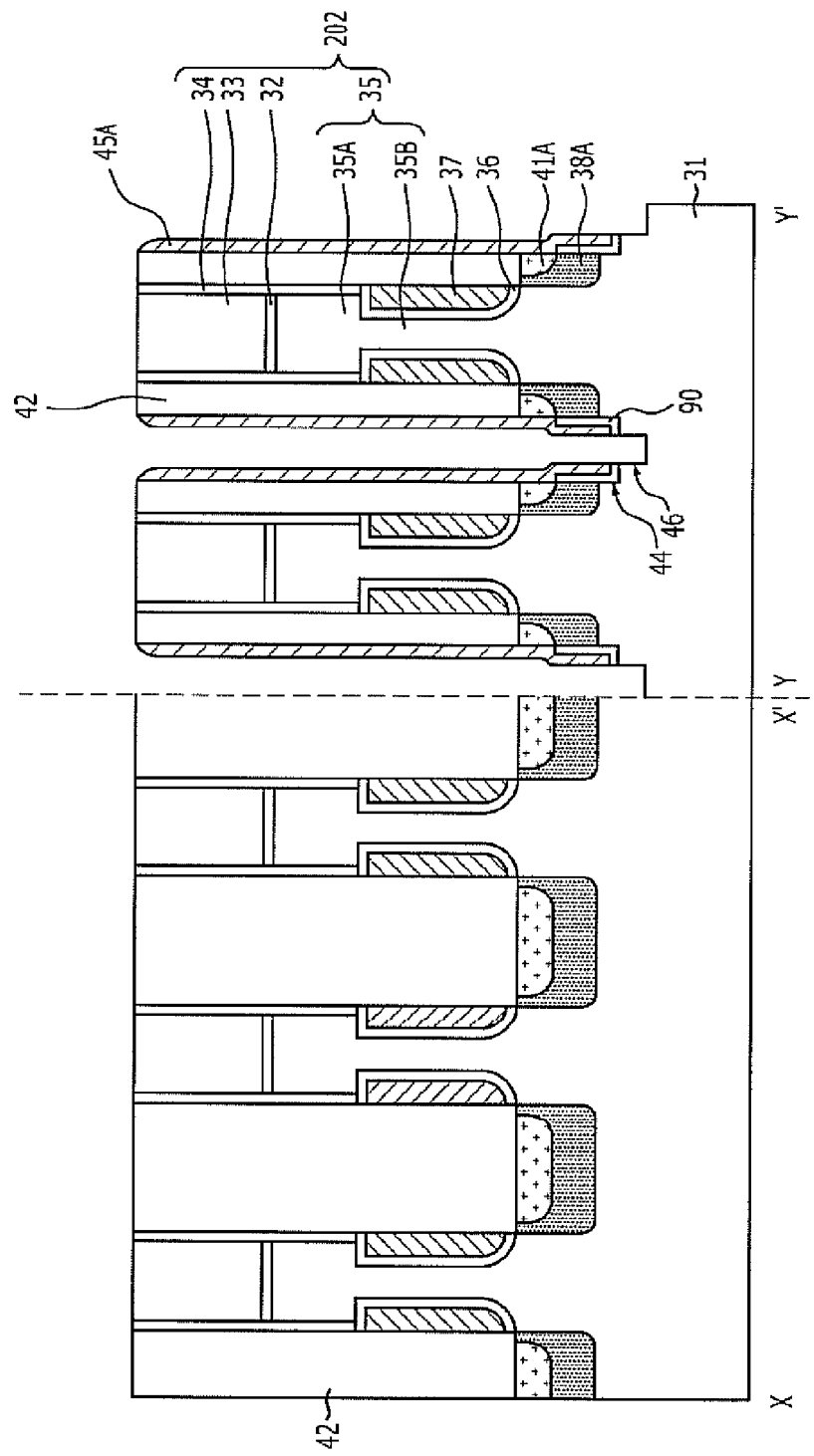

Referring to FIG. 3F, by conducting a second blanket etching process, the isolation layer 90 and the substrate 31 are partially etched to below the bottoms of the first trenches 44, by which second trenches 46 are formed. The second trenches 46 are formed to effectively isolate the metallic layer of adjoining buried bit lines. Since the remaining conductive layer 45A serves as an etch barrier, the second trenches 46 may have a line width smaller than the line width of the first trenches 44.

The second blanket etching process for forming the second trenches 46 may be conducted in same manner as the first blanket etching process, that is, as an etch-back process. The second blanket etching process may be conducted in situ in the same chamber used for the first blanket etching process.

Figure 3G:
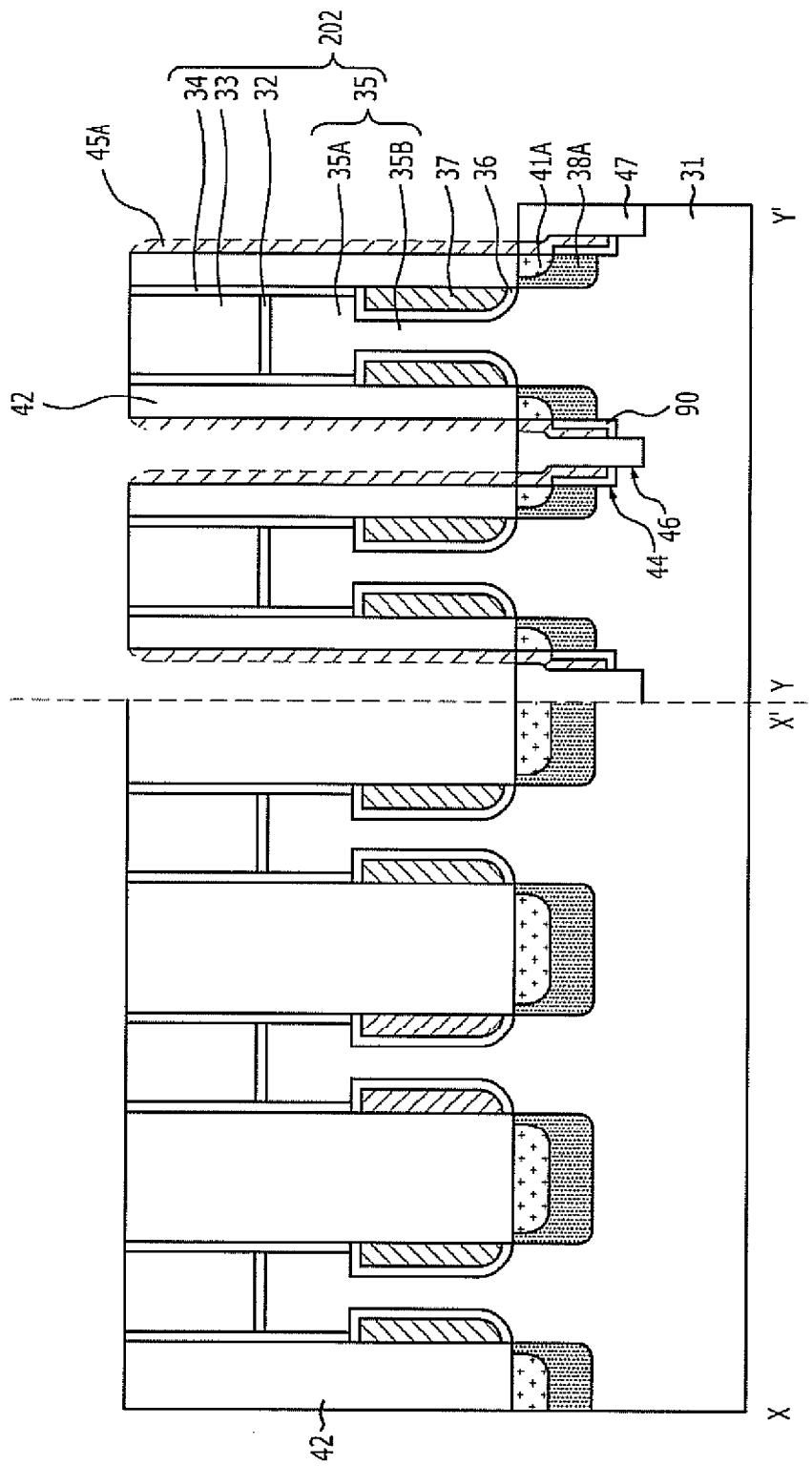

Referring to FIG. 3G, a second insulation layer 47 is formed to fill the first and second trenches 44 and 46. The second insulation layer 47 may be formed of any one selected from the group consisting of an oxide layer, a nitride layer and an oxynitride layer.

Although the second insulation layer 47 can be formed to fill the first and second trenches 44 and 46 and partially fill the gaps between the pillar structures 202, because of parasitic capacitance between the metallic layer of the buried bit lines which will be subsequently formed and the gate electrodes 37, the second insulation layer 47 is formed to fill only the first and second trenches 44 and 46. For example, the upper surface of the second insulation layer 47 may be on the same plane as the upper surface of the substrate 31.

Portions of the conductive layer 45A, which remain on the sidewalls of the pillar structures 202 and are exposed after the formation of the second insulation layer 47, are removed. Portions of the conductive layer 45A which are formed over the sidewalls of the first trenches 44 are not removed and remain, due to the formation of the second insulation layer 47. These portions of the conductive layer 45A which remain on both sidewalls of the first trenches 44 due to the formation of the second insulation layer 47 serve as the metallic layer 45B of the buried bit lines.

Through the above-described procedures, buried bit lines 111 which have the metal silicide layer 41A and the metallic layer 45B can be formed.

Figure 3H:
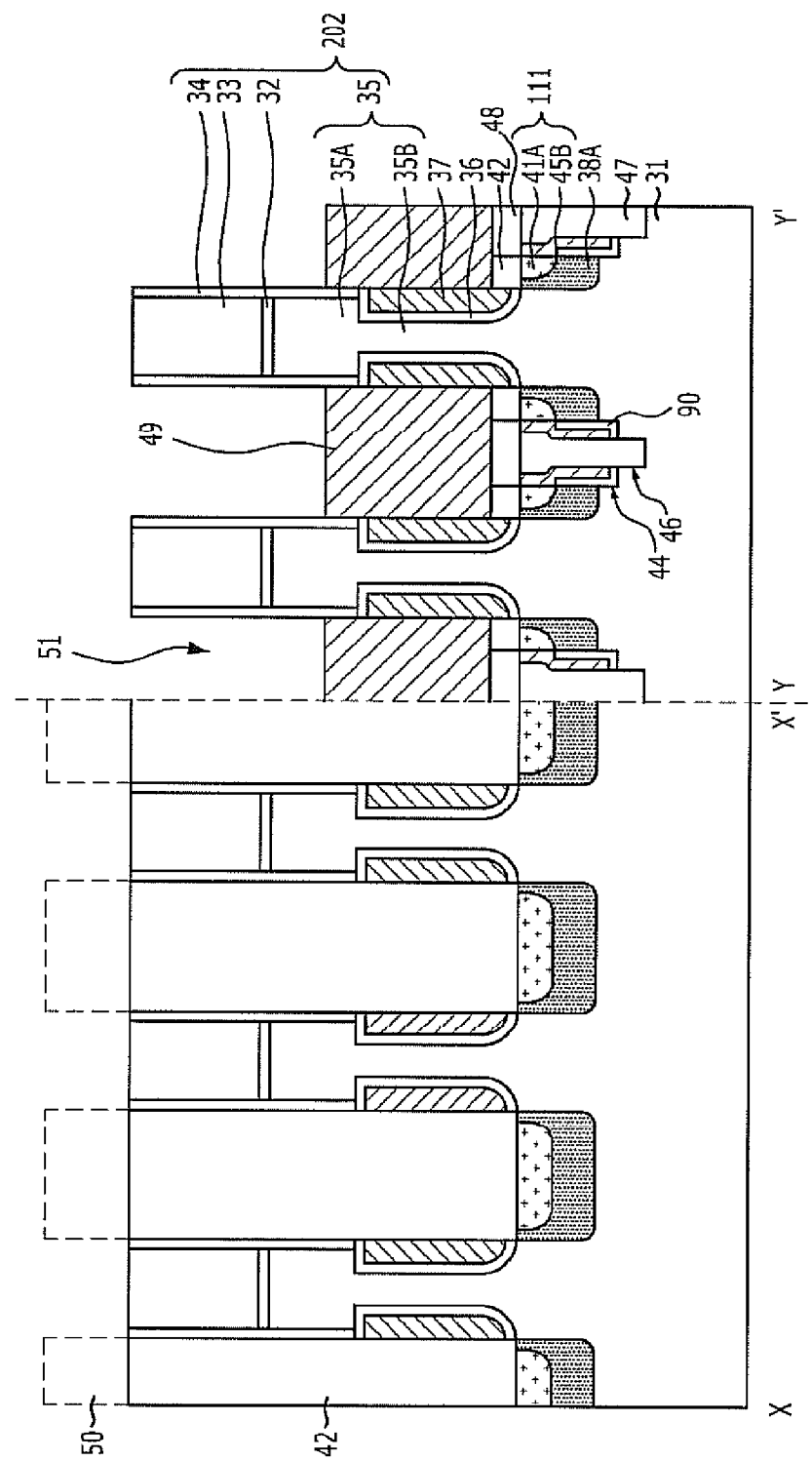

Referring to FIG. 3H, after forming a third insulation layer 48 to fill the gaps between the pillar structures 202, line-space type (that is, formed as lines with spaces in-between) second photoresist patterns 50 are formed in such a way to expose the first insulation layer 42 and the third insulation layer 48 in the Y-Y' direction. The second photoresist patterns 50 are formed in such a way that only the surfaces of the pillar structures 202 are exposed in the X-X' direction but all structures are exposed in the Y-Y' direction.

Dry etching is conducted in the Y-Y' direction using the second photoresist patterns 50 and the pillar structures 202 as etch barriers. Due to this operation, the first insulation layer 42 and the third insulation layer 48 are etched between the pillar structures 202 in the Y-Y' direction. An etch depth is controlled such that the first insulation layer 42 and the third insulation layer 48 are positioned lower than the uppermost surface of the gate electrodes 37. Accordingly, the first insulation layer 42 exists between the pillar structures 202 in the X-X' direction, and the first insulation layer 42 and the third insulation layer 48 remain in the Y-Y' direction in such a way as to expose the sidewalls of the gate electrodes 37 of the pillar structures 202.

Due to the above-described procedure, damascene patterns 51 for word lines are formed in the Y-Y' direction in such a way as to expose the upper portions of the outer walls of the gate electrodes 37.

For example, the damascene patterns 51 expose two thirds of the gate electrodes 37.

After removing the second photoresist patterns 50, word lines 49 are formed in such a way as to be partially filled into the damascene patterns 51 and be electrically connected with the gate electrodes 37. The word lines 49 are formed by depositing a metal-based layer and then recess-etching, for example, etching back, the metal-based layer. The height of the word lines 49 is adjusted so as not to expose the gate electrodes 37.

The word lines 49 may be formed to include at least any one selected from the group consisting of a tungsten silicide layer (WSi), a titanium nitride layer (TiN), a tungsten layer (W), an aluminum layer (Al), a copper layer (Cu), a gold layer (Au) and a ruthenium layer (Ru). A barrier metal layer (not shown) may be interposed between the gate electrodes 37 and the word lines 49. The barrier metal layer may include any one selected from the group consisting of TiN, TaCN, TaC, WN, WSiN, TaN, Ti and WSi.

As a method for depositing the word lines 49 and the barrier metal layer, atomic layer deposition (ALD), physical vapor deposition (PVD) or chemical vapor deposition (CVD) may be used.

As described above, in the present invention, by forming the impurity regions 38 and the buried bit lines 111 composed of the metal silicide layer 41A and the metallic layer 45B, the resistance of the buried bit lines 111 can be significantly reduced, and thus, a high speed operation of a semiconductor device can be ensured. Moreover, since an increase in the pitch of the buried bit lines 111 is not necessary, a unit cell area can be maintained and the characteristics of the semiconductor device which operates at a high speed can be satisfied.

Furthermore, by defining the second trenches 46 which separate the metallic layers 45B of the adjoining buried bit lines 111, the insulation characteristics between adjoining buried bit lines 111 can be effectively improved.

A method for fabricating a semiconductor device in accordance with another embodiment of the present invention, which will be described below, provides a fabrication method capable of further simplifying process steps for forming buried bit lines in comparison to the method for fabricating a semiconductor device in accordance with the aforementioned embodiment of the present invention. More specifically, in the method for fabricating a semiconductor device in accordance with another embodiment of the present invention, a metal silicide layer and a metallic layer of buried bit lines can be simultaneously formed.

FIGS. 4A through 4F are cross-sectional views illustrating a method for fabricating a semiconductor device with buried bit lines in accordance with another embodiment of the present invention, where the views represent cross-sections along the lines X-X' and Y-Y' of FIG. 2B. Herein, for the sake of convenience in explanation, detailed description of processes similar to those of the method for fabricating a semiconductor device in accordance with the aforementioned embodiment of the present invention will be omitted.

Figure 4A:
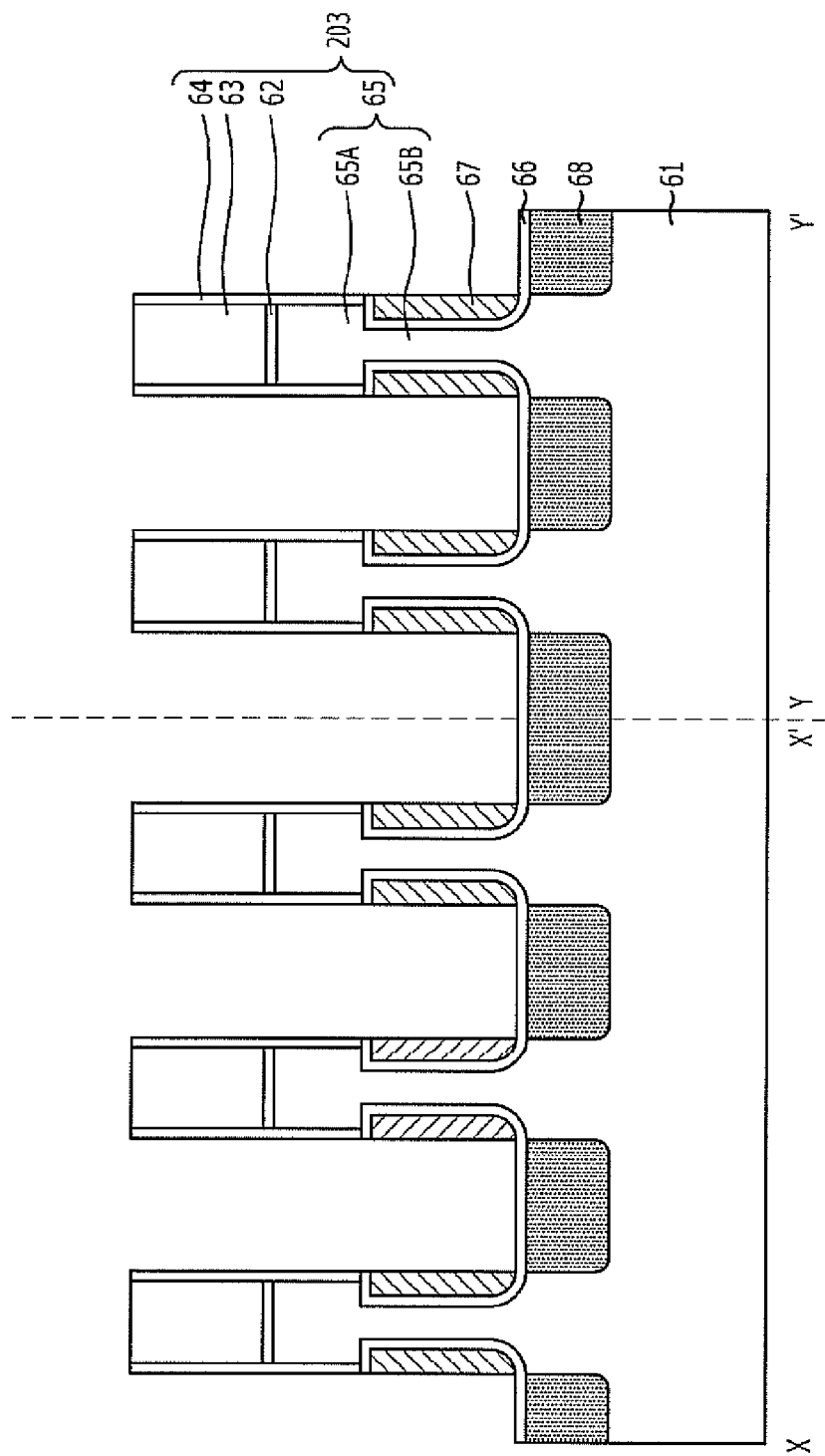

Referring to FIG. 4A, a plurality of pillar structures 203 are formed on a substrate 61, for example, a silicon substrate, in a manner such that they are separated from one another by a predetermined distance in a matrix shape and extend in the vertical direction from the substrate 61. Each pillar structure 203 may include an active pillar 65 which is composed of a head pillar 65A and a body pillar 65B, a buffer layer pattern 62, a hard mask layer pattern 63, a capping layer 64. As shown in FIG. 4A, the active pillar 65 may be formed as a jar type which is composed of the head pillar 65A and the body pillar 65B, or a rod type. When the active pillar 65 is formed as the jar type rather than the rod type, it is easier to secure a processing margin in a subsequent process for forming buried bit lines.

A gate insulation layer 66 is formed on the exposed surfaces of the substrate 61 and the body pillars 65B. The gate insulation layer 66 may be formed of an oxide layer, for example, as a silicon oxide layer. The gate insulation layer 66 may be formed through a deposition process or an oxidation process to a thickness of approximately 50 Å.

Gate electrodes 67 are formed in such a way as to surround the sidewalls of the body pillars 65B on which the gate insulation layer 66 is formed. The gate electrodes 67 are obtained by depositing a conductive layer over the resultant structure and conducting etch-back until the gate insulation layer 66 on the substrate 61 is exposed between the active pillars 65. As the gate electrodes 67, a polysilicon layer doped with N-type impurities or a polysilicon layer doped with P-type impurities may be employed. Also, the gate electrodes 67 may include a metal-containing layer such as a silicon germanium layer (SiGe), a tungsten layer (W), a tungsten silicide layer (WSi) and a titanium nitride layer (TiN).

By implanting impurity ions into the substrate 61 between the active pillars 65, impurity regions 68 are formed in the substrate 61. The impurity regions 68 serve as source/drain regions. The impurity regions 68 not only serve as source/drain regions but also serve as portions of buried bit lines. Here, as the impurities, N-type impurities such as phosphorus (P) and arsenic (As) or N-type impurities such as boron (B) may be used.

Figure 4B:
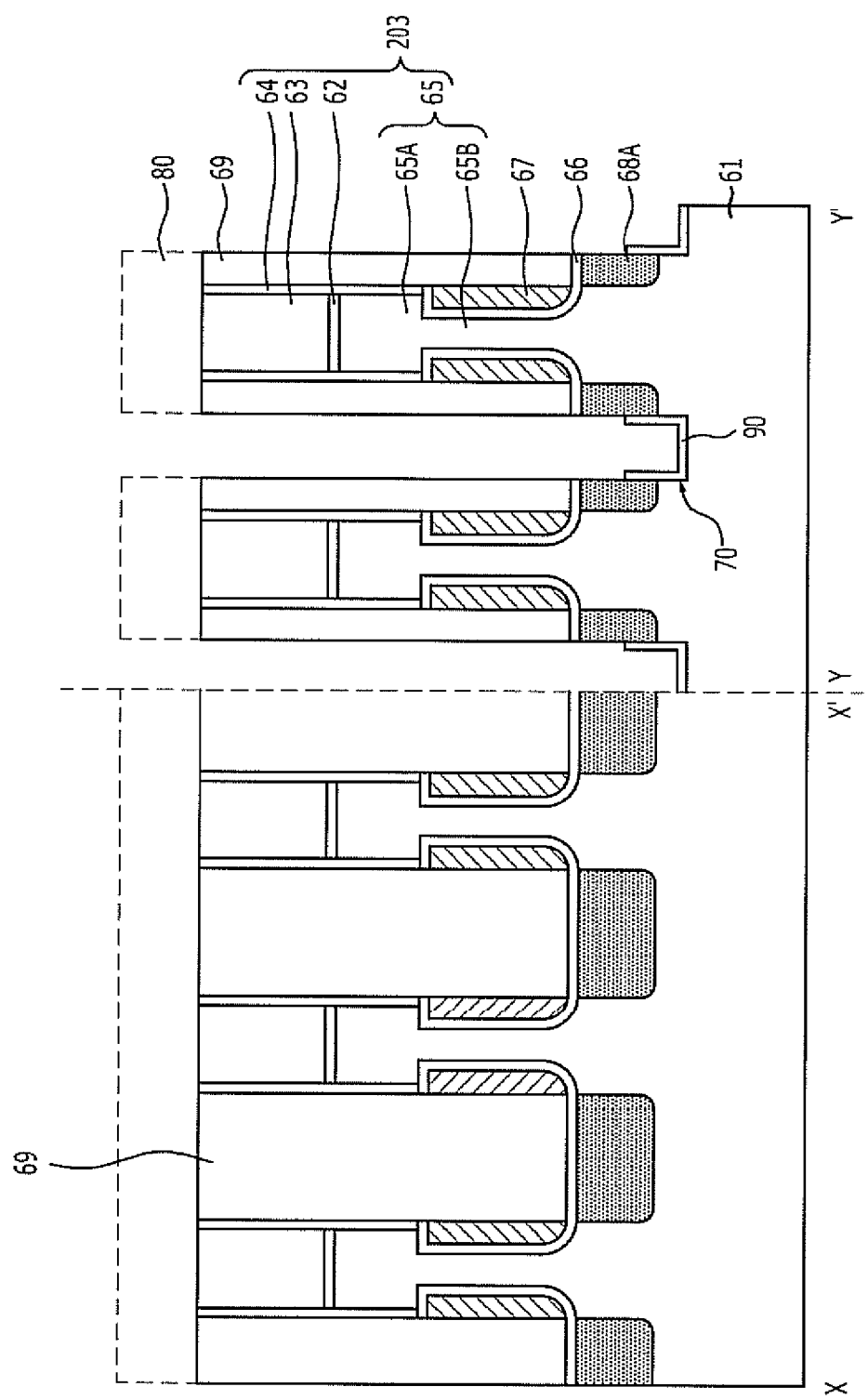

Referring to FIG. 4B, a first insulation layer 69 is formed over the resultant structure in such a way as to fill the gaps between the pillar structures 203. The first insulation layer 69 may be formed of any one selected from the group consisting of an oxide layer, a nitride layer and an oxynitride layer. According to an example, a BPSG layer having better gapfill characteristics may be formed as the first insulation layer 69.

After the first insulation layer 69 is formed, a planarization process such as CMP may be conducted until the surfaces of the hard mask layer patterns 63 are exposed and remove surface unevenness.

Line-space type first photoresist patterns 80 are formed in such a way to expose the surface of the first insulation layer 69 between the pillar structures 203 along the Y-Y' direction. The surface of the first insulation layer 69 between the pillar structures 203 along the X-X' direction is covered by the first photoresist patterns 80.

The first insulation layer 69, the gate insulation layer 66, and the impurity regions 68 are sequentially etched using the first photoresist patterns 80 as etch barriers, and subsequently, the substrate 61 is partially etched to form first trenches 70. Thus, the first trenches 70 when formed pass through the impurity regions 68. Hereafter, the impurity regions 68 which are divided by the first trenches 70 will be denoted by the reference numeral 68A.

The first photoresist patterns 80 are removed.

An isolation layer 90 is formed to cover portions of the first trenches 70. More specifically, the isolation layer 90 is formed to cover surface portions of each first trench 70 excluding the entire or partial portions of the impurity regions 68A over the sidewalls of the first trench 70. The isolation layer 90 isolates a metallic layer of the buried bit lines to be formed through a subsequent process and the substrate 61, and may be formed of an insulation layer.

The isolation layer 90 may be formed through a series of processes of depositing an insulation layer (not shown) for an isolation layer along the surface of the resultant structure including the first trenches 70, depositing a sacrificial layer (not shown) to partially fill the first trenches 70, removing the insulation layer for an isolation layer which is exposed out of the sacrificial layer, and then removing the sacrificial layer.

Referring to FIG. 4C, a conductive layer 71 for forming the buried bit lines is formed over the resultant structure including the first trenches 70. The conductive layer 71 may be formed of a single layer composed of a metal-based layer or a metal nitride layer or a stack layer in which a metal-based layer and a metal nitride layer are stacked. At this time, a metal silicide layer and a metallic layer of the buried bit lines may be simultaneously formed in order to improve processing efficiency. According to an example, the conductive layer 71 may be formed of a stack layer in which a metal-based layer and a metal nitride layer are stacked.

The stack layer of the metal-based layer and the metal nitride layer constituting the conductive layer 71 may contain any one metal element selected from the group consisting of titanium (Ti), tantalum (Ta), cobalt (Co), nickel (Ni) and tungsten (W). When the conductive layer 71 containing the metal element forms an ohmic contact with the impurity regions 68A, the contact resistance therebetween can be reduced.

By conducting a first blanket etching process, the conductive layer 71 remains only on both sidewalls of the first trenches 70 and on the first insulation layer 69 which are present on the sidewalls of the pillar structures 203. The first blanket etching process may be conducted as an etch-back process. Hereafter, the etched conductive layer 71 will be denoted by the reference numeral 71A.

The first blanket etching process is conducted to divide the conductive layers 71A for the buried bit lines between adjoining cells.

Figure 4D:
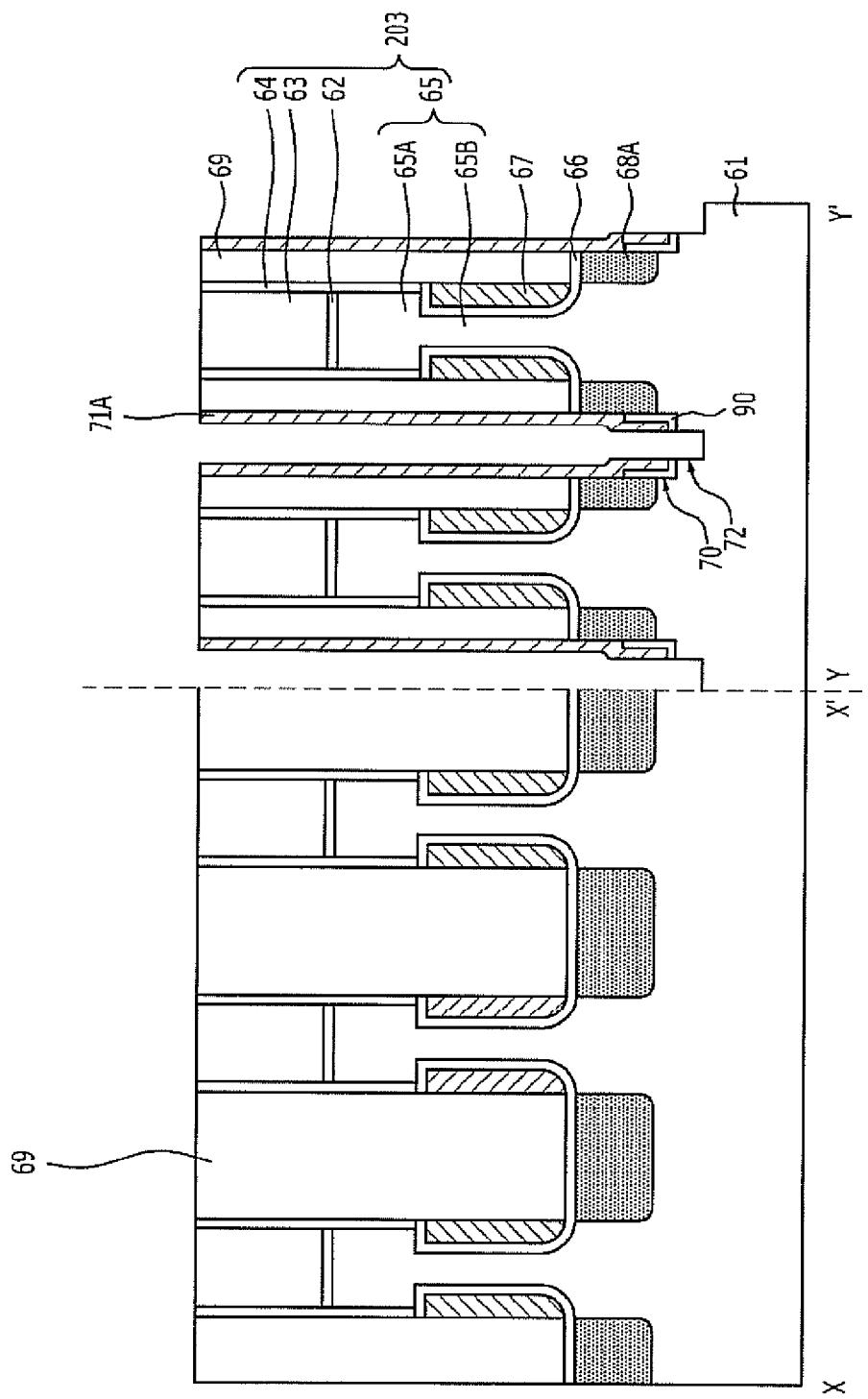

Referring to FIG. 4D, by conducting a second blanket etching process, the isolation layer 90 and the substrate 61 are partially etched to below the bottoms of the first trenches 70, by which second trenches 72 are formed. The second trenches 72 are formed to effectively isolate the conductive layer 71A of adjoining buried bit lines. Since the remaining conductive layer 71A serves as an etch barrier, the second trenches 72 may have a line width smaller than the line width of the first trenches 70.

The second blanket etching process for forming the second trenches 72 may be conducted in same manner as the first blanket etching process, that is, as an etch-back process. The second blanket etching process may be conducted in situ in the same chamber used for the first blanket etching process.

Figure 4E:
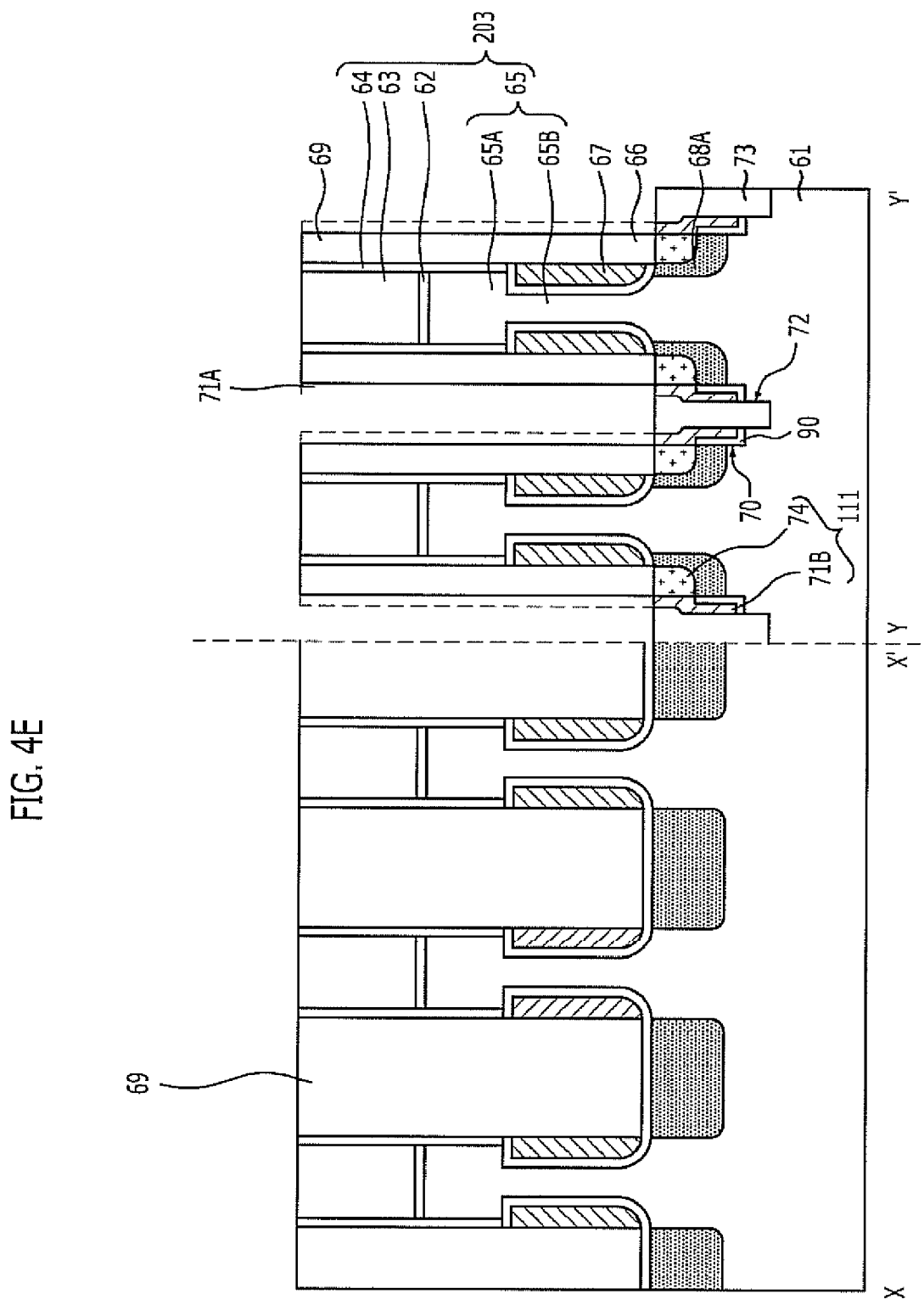

Referring to FIG. 4E, a second insulation layer 73 is formed to fill the first and second trenches 70 and 72. The second insulation layer 73 may be formed of any one selected from the group consisting of an oxide layer, a nitride layer and an oxynitride layer.

Although the second insulation layer 73 can be formed to fill the first and second trenches 70 and 72 and partially fill the gaps between the pillar structures 203, because of parasitic capacitance between the buried bit lines which will be subsequently formed and the gate electrodes 67, the second insulation layer 73 is formed to fill only the first and second trenches 70 and 72. For example, the upper surface of the second insulation layer 73 may be placed on the same plane as the upper surface of the substrate 61.

Portions of the conductive layer 71A, which remain on the sidewalls of the pillar structures 203 and are exposed after the formation of the second insulation layer 73, are removed. Portions of the conductive layer 71A which are formed over the sidewalls of the first trenches 70 are not removed and remain, due to the formation of the second insulation layer 73.

These portions of the conductive layer 71A which remain on both sidewalls of the first trenches 70 serve as the metallic layer 71B of the buried bit lines.

By annealing, the buried bit lines 111 which are composed of a metal silicide layer 74 and the metallic layer 71B are formed. More specifically, the metal constituents which are contained in the metallic layer 71B, that is, the metal constituents of the metal-based layer in the stack structure of the metal-based layer and metal nitride are diffused into the substrate 61 on the sidewalls of the first trenches 70, by the heat energy applied during the annealing, and the diffused metal constituents react with the silicon constituent of the substrate 61, for example, a silicon substrate, by which the metal silicide layer 74 is formed. The metal silicide layer 74 serves as the buried bit lines. The inner boundary of the metal silicide layer 74 contacts the impurity regions 68A.

The annealing may be conducted as rapid thermal annealing so as to minimize a thermal stress imposed on the previously formed structure.

In this way, according to an embodiment of the present invention, since the metal silicide layer 74 is formed using the metallic layer 71B of the buried bit lines 111, the processes for forming the buried bit lines 111 can be simplified, and thus, the productivity of a semiconductor device having the buried bit lines 111 can be improved.

Figure 4F:
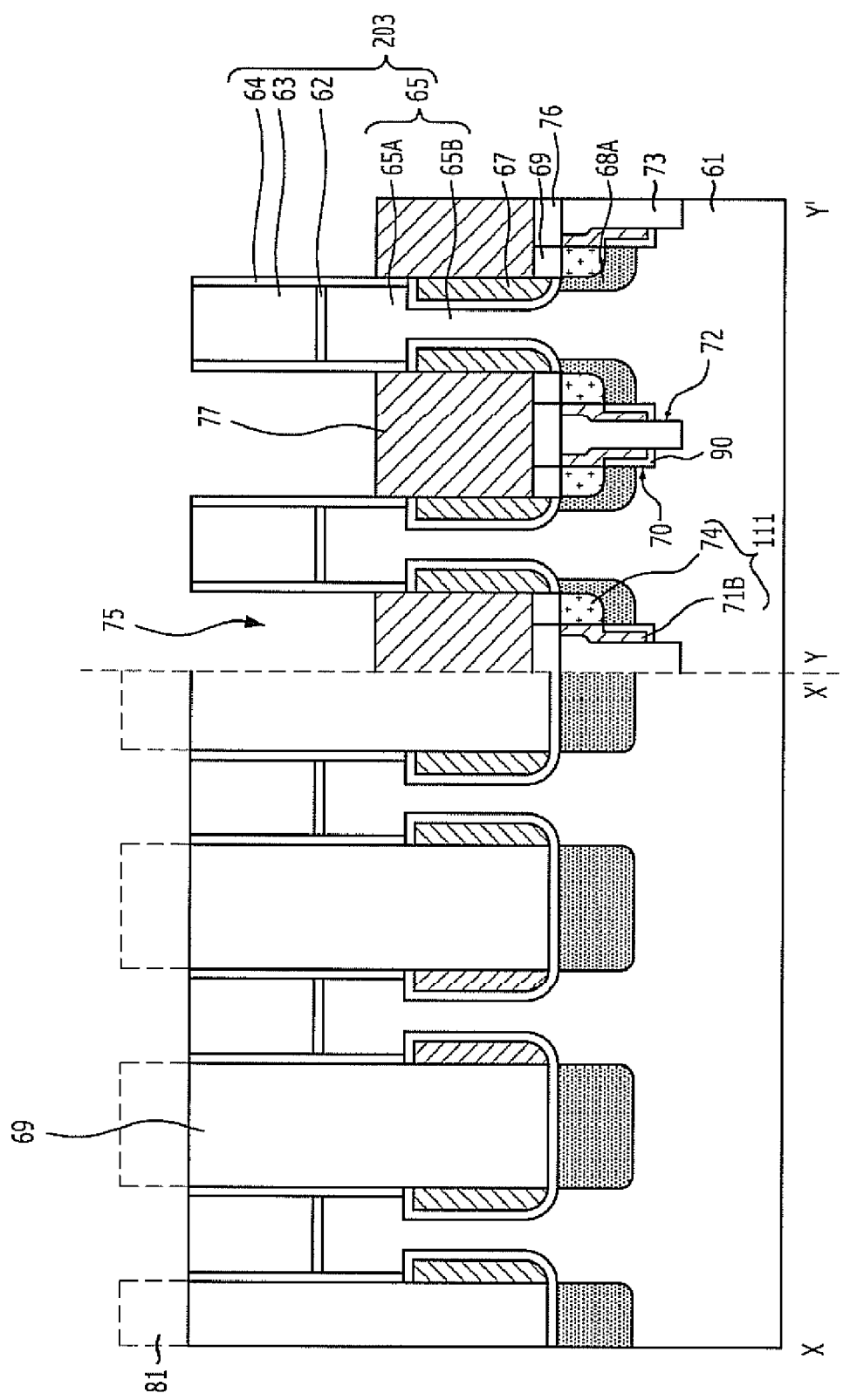

Referring to FIG. 4F, after forming a third insulation layer 76 to fill the gaps between the pillar structures 203, line-space type second photoresist patterns 81 are formed in such a way to expose the first insulation layer 69 and the third insulation layer 76 in the Y-Y' direction. With the second photoresist patterns 81, only the surfaces of the pillar structures 203 are exposed in the X-X' direction, and all structures are exposed in the Y-Y' direction.

Dry etching is conducted in the Y-Y' direction using the second photoresist patterns 81 and the pillar structures 203 as etch barriers. Due to this operation, the first insulation layer 69 and the third insulation layer 76 are etched between the pillar structures 203 in the Y-Y' direction. An etch depth is controlled such that the first insulation layer 69 and the third insulation layer 76 are positioned lower than the uppermost surfaces of the gate electrodes 67. Accordingly, the first insulation layer 69 exists between the pillar structures 203 in the X-X' direction, and the first insulation layer 69 and the third insulation layer 76 remain in the Y-Y' direction in such a way as to expose the sidewalls of the gate electrodes 67 of the pillar structures 203.

Due to the above-described procedure, damascene patterns 75 for word lines are formed in the Y-Y' direction in such a way as to expose the upper portions of the outer walls of the gate electrodes 67. For example, the damascene patterns 75 expose two thirds of the gate electrodes 67.

After removing the second photoresist patterns 81, word lines 77 are formed in such a way as to be partially filled into the damascene patterns 75 and be electrically connected with the gate electrodes 67. The word lines 77 are formed by depositing a metal-based layer and then recess-etching, for example, etching back, the metal-based layer. The height of the word lines 77 is adjusted so as not to expose the gate electrodes 67.

The word lines 77 may be formed to include at least any one selected from the group consisting of a tungsten silicide layer (WSi), a titanium nitride layer (TiN), a tungsten layer (W), an aluminum layer (Al), a copper layer (Cu), a gold layer (Au) and a ruthenium layer (Ru). A barrier metal layer (not shown) may be interposed between the gate electrodes 67 and the word lines 77. The barrier metal layer may include any one selected from the group consisting of TiN, TaCN, TaC, WN, WSiN, TaN, Ti and WSi.

As a method for depositing the word lines 77 and the barrier metal layer, atomic layer deposition (ALD), physical vapor deposition (PVD) or chemical vapor deposition (CVD) may be used.

As described above, in the present invention, by forming the impurity regions 68A and the buried bit lines 111 composed of the metal silicide layer 74 and the metallic layer 71B, the resistance of the buried bit lines 111 can be significantly reduced, and thus, a high speed operation of a semiconductor device can be ensured. Moreover, since an increase the pitch of the buried bit lines 111 is not necessary, a unit cell area can be maintained and the characteristics of the semiconductor device which operates at a high speed can be satisfied.

Furthermore, by defining the second trenches 72 which separate the metallic layers 71B of the adjoining buried bit lines 111, the insulation characteristics between adjoining buried bit lines 111 can be effectively improved.

In addition, by forming the metal silicide layer 74 using the metallic layer 71B, the fabricating processes of the buried bit lines 111 can be simplified to thus improve the productivity of the semiconductor device.

As is apparent from the above description, the present invention provides advantages in that, since buried bit lines are composed of a metal silicide layer and a metallic layer, the resistance can be significantly reduced when compared to the conventional buried bit lines in the form of silicon wiring lines.

Thus, according to an embodiment of the present invention, high speed operation of a semiconductor device can be ensured. Also, since an increase the pitch of the buried bit lines is not necessary, a unit cell area can be maintained and the characteristics of the semiconductor device which operates at a high speed can be satisfied.

Furthermore, by forming the metal silicide layer using a metallic layer, a process for forming the buried bit lines can be simplified to thus improve the productivity of the semiconductor device.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a substrate having trenches;
   buried bit lines formed in the substrate and including a metal silicide layer and a metallic layer, wherein the metal silicide layer forms sidewalls of the trenches and the metallic layer is formed over the sidewalls of the trenches and contacts the metal silicide layer; and
   an isolation layer interposed between surfaces of the trenches and the metallic layer but not at regions where the metal silicide layer and the metallic layer contact each other.

2. The semiconductor device of claim 1, further comprising:
   impurity regions formed in the substrate and contacting the metal silicide layer.

3. The semiconductor device of claim 2, wherein the buried bit lines have specific resistance lower than that of the impurity regions.

4. The semiconductor device of claim 1, wherein the trenches comprise first trenches which having sidewalls formed by the metal silicide layer and second trenches which are formed under the first trenches and have a width smaller than that of the first trenches.

5. The semiconductor device of claim 4, wherein the metallic layer is positioned over the sidewalls of the first trenches.

6. The semiconductor device of claim 1, wherein the metal silicide layer comprises any one selected from the group consisting of a titanium silicide layer, a tantalum silicide layer, a cobalt silicide layer, a nickel silicide layer, and a tungsten silicide layer.

7. The semiconductor device of claim 1, wherein the metallic layer comprises a single layer including a metal-based layer or a metal nitride layer, or a stack layer in which a metal-based layer and a metal nitride layer are stacked.

8. The semiconductor device of claim 7, wherein the stack layer of the metal-based layer and the metal nitride layer contains any one metal element selected from the group consisting of titanium, tantalum, cobalt, nickel and tungsten.

9. The semiconductor device of claim 1, further comprising:
a plurality of active pillars formed over the substrate;
gate electrodes surrounding outer walls of the active pillars;
an insulation layer filled in the trenches; and
word lines connecting the gate electrodes in a direction crossing the buried bit lines.

10. A method for fabricating a semiconductor device, comprising:
forming a metal silicide layer in a substrate;
forming first trenches by selectively etching the substrate and the metal silicide layer such that the metal silicide layer partially forms sidewalls of the first trenches;
forming an isolation layer to cover surfaces of the first trenches but not at regions where the metal silicide layer partially forms the sidewalls of the first trenches; and
forming buried bit lines including the metal silicide layer and a metallic layer, wherein the metallic layer is formed on the sidewalls of the first trenches including the isolation layer, and the metallic layer contacts the metal silicide layer.

11. The method of claim 10, further comprising:
forming, before the forming of the metal silicide layer, impurity regions by implanting impurity ions into the substrate such that the impurity regions contact the metal silicide layer.

12. The method of claim 11, wherein the buried bit lines have specific resistance lower than that of the impurity regions.

13. The method of claim 10, further comprising:
forming, after the forming of the metallic layer, second trenches by etching the isolation layer and a surface of the substrate under the etched isolation layer.

14. The method of claim 10, wherein the metal silicide layer is formed in such a way as to form at least one sidewall of each of the first trenches.

15. The method of claim 10, wherein the metal silicide layer is formed of any one selected from the group consisting of a titanium silicide layer, a tantalum silicide layer, a cobalt silicide layer, a nickel silicide layer, and a tungsten silicide layer.

16. The method of claim 10, wherein the metallic layer is formed of a single layer including a metal-based layer or a metal nitride layer, or a stack layer in which a metal-based layer and a metal nitride layer are stacked.

17. The method of claim 16, wherein the stack layer of the metal-based layer and the metal nitride layer contains any one metal element selected from the group consisting of titanium, tantalum, cobalt, nickel and tungsten.

18. The method of claim 10, further comprising:
forming, before the formation of the buried bit lines, a plurality of active pillars over the substrate; and
forming gate electrodes which respectively surround outer walls of the active pillars, and
forming, after the formation of the buried bit lines, an insulation layer to fill the first trenches; and
forming word lines which connect the gate electrodes in a direction crossing with the buried bit lines.

19. A method for fabricating a semiconductor device, comprising:
forming first trenches by selectively etching a substrate;
forming an isolation layer to partially form sidewalls of the first trenches;
forming a metallic layer on the sidewalls of the first trenches including regions of the sidewalls formed by the isolation layer and regions of the sidewalls other than the regions of the sidewalls formed by the isolation layer; and
forming buried bit lines including the metal layer and a metal silicide layer, wherein the metal silicide layer is formed in the substrate by conducting an annealing, and the metal silicide layer contacts the metallic layer.

20. The method of claim 19, further comprising:
forming, before the forming of the first trenches, impurity regions by implanting impurity ions into the substrate such that the impurity regions contact the metal silicide layer.

21. The method of claim 20, wherein the buried bit lines have specific resistance lower than that of the impurity regions.

22. The method of claim 19, further comprising:
forming, after the forming of the metallic layer, second trenches by etching the isolation layer and the substrate under the etched isolation layer.

23. The method of claim 19, wherein the metal silicide layer is formed to form at least one sidewall of each of the first trenches.

24. The method of claim 19, wherein the metal silicide layer is formed of any one selected from the group consisting of a titanium silicide layer, a tantalum silicide layer, a cobalt silicide layer, a nickel silicide layer, and a tungsten silicide layer.

25. The method of claim 19, wherein the metallic layer is formed of a stack layer in which a metal-based layer and a metal nitride layer are stacked.

26. The method of claim 25, wherein the stack layer of the metal-based layer and the metal nitride layer contains any one metal element selected from the group consisting of titanium, tantalum, cobalt, nickel and tungsten.

27. The method of claim 19, further comprising:
forming, before the forming of the buried bit lines, a plurality of active pillars over the substrate and gate electrodes which respectively surround outer walls of the active pillars, and
forming, after the forming of the buried bit lines, an insulation layer to fill the first trenches and word lines which connect the gate electrodes in a direction crossing the buried bit lines.

* * * * *